United States Patent [19]
Hankui et al.

[11] Patent Number: 5,514,971
[45] Date of Patent: May 7, 1996

[54] METHOD AND APPARATUS FOR TESTING AN IMMUNITY TO ELECTROMAGNETIC INTERFERENCE AND APPARATUS FOR IRRADIATING RADIO WAVE FOR IMMUNITY TEST

[75] Inventors: Eiji Hankui; Takashi Harada, both of Tokyo, Japan

[73] Assignee: NEC Corporation, Tokyo, Japan

[21] Appl. No.: 248,256

[22] Filed: May 24, 1994

[30] Foreign Application Priority Data

May 24, 1993 [JP] Japan ..................................... 5-120294
Dec. 27, 1993 [JP] Japan ..................................... 5-330276

[51] Int. Cl.$^6$ ................................................. G01R 27/04
[52] U.S. Cl. ........................... 324/639; 324/501; 324/537; 324/754; 324/628
[58] Field of Search ..................... 324/501, 512, 324/527, 537, 754, 765, 602, 605, 606, 613, 620, 627, 628, 638, 639

[56] References Cited

U.S. PATENT DOCUMENTS

| | | | |
|---|---|---|---|
| 4,271,389 | 6/1981 | Jacobi et al. | 324/639 |
| 4,278,933 | 7/1981 | Klopach et al. | 324/627 |
| 4,514,680 | 4/1985 | Heikkilä et al. | 324/639 |
| 5,128,621 | 7/1992 | Berthaud et al. | 324/639 |

FOREIGN PATENT DOCUMENTS

WO92/05601 4/1992 WIPO .

OTHER PUBLICATIONS

"Guideline of Immunity Test in Information Processor and System", Sep. 1992, Second Edition, pp. 1, 4, 5, 8 and 9, with Concise Explanation in English.
By J. Dyson, "Measurement of Near Fields of Antennas and Scatterers", IEEE Transactions on Antennas and Propagation, Jul. 1973, vol. AP–21, No. 4, pp. 446–460.
By S. Zaky et al., "Susceptibility Mapping", 1992 International Symposium on Electromagnetic Compatibility, Aug. 17–21, 1992, pp. 439–442.

Primary Examiner—Kenneth A. Wieder
Assistant Examiner—Glenn W. Brown
Attorney, Agent, or Firm—Young & Thompson

[57] ABSTRACT

An apparatus for measuring an electromagnetic wave stress of an article includes an electromagnetic wave irradiation unit comprising a plurality of radiation probes being adjacent to each other along a surface of the article at least on one side thereof so as to permit the probes to irradiate independently electromagnetic waves on divided local areas on a surface of the article corresponding to the locations of the probes. The apparatus also includes a control unit electrically connected to the article for receiving output signals having information as to existences of any abnormalities in individual divided local areas in the article exposed to an electromagnetic wave irradiation, the control unit being electrically connected to the transmitted unit for controlling operations of the transmitter unit to control independently an excitation of each radiation probe.

28 Claims, 18 Drawing Sheets

FOURIER TRANSFORMATION

FOURIER TRANSFORMATION 211A, 211B, 221A:

METHOD AND APPARATUS FOR TESTING AN IMMUNITY TO ELECTROMAGNETIC INTERFERENCE AND APPARATUS FOR IRRADIATING RADIO WAVE FOR IMMUNITY TEST

BACKGROUND OF THE INVENTION

The invention relates to an apparatus for testing an immunity of various electric devices against electromagnetic interference and a method of testing and the immunity thereof, and more particularly to an apparatus and method for measuring and evaluating an immunity or a radio wave stress of various electric devices such as printed circuit boards, circuit elements and any electric and electronics devices as well as an apparatus for irradiating an electromagnetic wave or a radio wave for the immunity testing.

The value and importance of testing and measuring an immunity and electromagnetic wave stresses of any electronic devices such as digital circuits against various sources of electromagnetic wave interferences or radio wave interferences have been on the increase in view of electromagnetic environmental problems. These problems are serious problems on account of increase of an amount of irradiation of extra electromagnetic energies, typically excess radio noises. The concept of the electromagnetic environmental problems or electromagnetic compatibility had been established. The problem with radio noise interferences are serious. The radio noise may be defined as an electromagnetic wave which is able to be superimposed on an information signal, thereby causing an interference with any transmission of the informational signals. The device which may suffer the radio noise interference may include various electric and electronics devices involving, for example, printed circuit boards and cables. A radio noise which has entered into an electric or electronics device is able to cause a radio noise interference which places this device in an abnormal state, thereby resulting in various malfunctions of the device. Even if the electric or electronic device potentially possesses excellent performances, such device having suffered the radio noise interferences are no longer able to show such excellent performance.

From the above descriptions, the importance in establishing a useful technique for testing and measuring the immunity of the electric and electronics devices to the electromagnetic wave interference or the radio wave interferences could readily be appreciated.

One of the conventional techniques for testing the immunity of any electric and electronics devices to the radio noise interference is disclosed in September 1992 JEIDA-G10 second edition Chapter 3, pp. 4–5, "Guide Line for Immunity Test of Information Processing Equipment and System". The description will hereinafter focus on a structural explanation of the conventional immunity testing apparatus with reference to FIG. 1.

As illustrated in FIG. 1, the conventional radio wave immunity testing apparatus has an oscillator 5 for oscillating a frequency signal S. The conventional radio wave immunity testing apparatus also has an amplifier 7 being electrically connected to the oscillator 5 for fetching the frequency signal S for subsequent amplification of the fetched frequency signal S to generate a radio wave electrical signal P. The conventional radio wave immunity testing apparatus also has an antenna 8 being electrically connected to the amplifier 7 for fetching the radio wave electrical signal P to generate a testing radio wave R being usable for the electromagnetic stress test. The testing radio wave R is irradiated on a measuring sample 6 which is placed at a position of several meters from the antenna 8. The measuring sample 6 may be any electrical or electronics device having a tendency to suffer any impact due to the electromagnetic wave interference. The oscillator 5 is able to conduct an output control for controlling a level of the frequency signal S to be transmitted to the amplifier 7. The amplifier 7 is able to show a gain control for controlling a level of the radio wave electrical signal P to be transmitted to the antenna 8. The antenna 8 may be a large size and high gain bi-conical antenna or log-periodic antenna. The antenna 8 is adjustable in height for radiating a standardized radio wave R on the measuring sample 6 where the standardized radio wave R is a vertically or horizontally deflected radio wave having a standardized level in intensity of the electric field. The intensities in the electromagnetic fields may be classified into three levels as shown below.

TABLE I

| Level | Intensity of Electric Field (V/m) | Intensity of Magnetic Field (dB micro-A/m) |
| --- | --- | --- |
| 1 | 1 | 88.5 |
| 2 | 3 | 78.0 |
| X | Special | 68.5 |

TABLE 1 shows each level in the individual intensities of the electric and magnetic fields where the intensity of the magnetic field is calculated by converting the radio impedance 377 (ohm).

The above described electromagnetic stress test is accomplished within a large size electromagnetic environmental installation such as a radio wave darkroom capable of shielding any electromagnetic wave.

The above electromagnetic wave stress test may be implemented by evaluating whether the measuring sample 6 receiving the irradiation of the testing radio wave R shows a normal performance or an abnormal performance caused by the radio wave interference. When testing the immunity of a computer such as a personal computer, the testing radio wave R is irradiated on the computer which is executing a predetermined test program so as to evaluate whether the computer is able to correctly execute the test program or is unable to execute the test program to find any interruption of the execution of the test program due to the electromagnetic interference. When the measured sample 6 is any display device, the immunity ay be evaluated by irradiating the testing radio wave R on the display device as a measuring sample 6 so as to check any disturbance of a picture on a screen of the display device.

The above described immunity testing apparatus is able to test the electromagnetic wave stress test for a relatively large electric or electronics equipment, while another type of the immunity testing apparatus for measuring the electromagnetic wave stress of a relatively small measuring sample is disclosed in the above publication. The description thereof will be made with reference to FIG. 2.

As illustrated in FIG. 2, this other type of the conventional immunity testing apparatus has a TEM cell 9 in which the measuring sample 6 is accommodated. The TEM cell 9 comprises an enclosure member 92 and a central electrode 91, both of which are made of an electrically conductive material or such materials and further which must be separated electrically. The central electrode 91 is placed at the center position within the enclosure member 92. In FIG. 2, the enclosure member 92 and the central electrode 91 may serve as electrodes respectively so as to cause the transverse electromagnetic wave within the enclosure member 92 where the electric field E from the enclosure member 92 toward the central electrode 91 is illustrated. The measuring sample 6 placed in the enclosure member 92 of the TEM cell is then subjected to irradiation with the transverse electromagnetic wave (TEM wave) for the electromagnetic stress test for the measuring sample 6.

This other type of the immunity testing apparatus illustrated in FIG. 2 also includes a standardized signal generator 5 for generating a standardized signal. This other type of the immunity testing apparatus also includes an amplifier 7 being electrically connected at its input side to the standardized signal generator 5 for fetching the generated standardized signal from the standardized signal generator 5 for subsequent amplification of the standardized signal. The amplifier 7 is further electrically connected at its output side to one end of the enclosure member 92 in the TEM cell 9 so as to transmit the amplified signal to the enclosure member 92. The intensity of the electric field E is associated with the signal applied to the enclosure member 92. In the above, although the measuring sample 6 is accommodated in the enclosure member 92, the measuring sample 6 is required to be so placed as to be separated electrically not only from the central electrode 91 but also from the enclosure member 92 through an insulator. The enclosure member 92 in the TEM cell 9 has the opposite end at which the enclosure member 92 is electrically connected to a terminal 93 with an electrical resistance, for example, 50 ohm.

However, this conventional electromagnetic stress testing apparatus has problems as described below. In the conventional method for testing the immunity, the testing radio wave is irradiated on the entirety of the measuring sample 6. Hence, the above prior technique is unable to find or ascertain where an abnormal state appears within the measuring sample 6, even though it is able to confirm that the measuring sample 6 has been in the abnormal state. If the measuring sample device 6 is a personal computer, the conventional immunity testing apparatus is unable to determine the position where an abnormal operation appears. Namely, it is impossible for the prior art to confirm what element, for example, printed circuit boards accommodated in the personal computer body or an input-output key board or other element, is in an abnormal state. Accordingly, the conventional techniques for immunity test as illustrated in FIGS. 1 and 2 are merely able to ascertain that an abnormal state appears in at least one of the elements involved in the measuring sample 6, but would not be able to ascertain precisely what element involved in the measuring sample 6 has been in such an abnormal state.

Needless to say, it would, therefore, be very important to develop a novel method and apparatus for testing the immunity of any electric or electronics devices to confirm or ascertain precisely a position showing an abnormal operation within the measuring sample. Namely, it is required to provide novel immunity testing method and apparatus being able to ascertain precisely what element involved in the measuring sample 6 shows an abnormal operation or is in an abnormal state.

Moreover, techniques for antennas to be used in the immunity testing device would also be receiving a great deal of attention to realize an excellent and desirable immunity test for the electric and electronics device which tends to affect an impact of the interferences of the radio wave or the electromagnetic wave. Various types of antennas have been known in the art such as parabolic antennas and a loop antenna. It has been known in the art to use a loop antenna in place of parabolic antennas for applying locally an electromagnetic field on a part of a measuring sample.

An example of the loop antennas is disclosed in 1992 IEEE International Symposium On ELECTROMAGNETIC Comnpatibility pp. 439–442. As illustrated in FIG. 3, the loop antenna 61 is so positioned that a loop of the antenna faces in parallel to a surface of the measuring sample 6 at a distance of several centimeters. The above loop antenna has a diameter of several centimeters. In this case, the loop antenna is able to apply a magnetic field on a relatively small area on the surface of the measuring sample 6.

FIG. 4 illustrates a loop antenna 61 having a diameter of 16 millimeters where a magnetic field radiated from the loop antenna is measured by use of a probe. The probe is moved along the Y-axis for scanning wherein a distance between the loop of the antenna and the probe is 10 millimeters so that the probe may detect the magnetic field in a vertical component (Z-direction) and a horizontal component (X-direction). The probe may convert a variation of the detected magnetic field into a receiving voltage. FIG. 5 represents the result of the measurement of the magnetic field generated from the loop antenna 61 when the probe is moved along the Y-direction for scanning. In FIG. 5, a solid line represents a profile of receiving voltages corresponding to the vertical components of the measured magnetic field. Dotted lines represent profiles of receiving voltages corresponding to the horizontal components of the measured magnetic field. From FIG. 5, it could be understood that the vertical component of the measured magnetic field has a maximum value around a center position of the loop of the antenna 61. By contrast, the horizontal component of the measured magnetic field has a maximum value around diametrically opposite ends of the loop antenna. The maximum value of the vertical component of the measured magnetic field represented by the solid line is larger by about 6 dB than the maximum value of the horizontal component thereof represented by the dotted lines. This proves that the measuring sample 6 receives the magnetic field having not only the vertical composition but also the horizontal composition particularly around the diametrically opposite ends of the loop antenna. To realize the measurement of the electromagnetic stress of the measuring sample 6, it would, however, be required to apply a magnetic field having a vertical component only free of any horizontal component thereof. Particularly, the influence of the horizontal component of the magnetic field against the measurement of the electromagnetic stress of the measuring sample 6 may be considerable. When the loop antenna is used, it would be required according to the regulation to apply such a magnetic field as having any one of the vertical and horizontal components for a desired measurement of the electromagnetic stress of the measuring sample 6.

It would therefore be required to develop a novel antenna which permits a desirable local measurement of the electromagnetic stress test.

SUMMARY OF THE INVENTION

Accordingly, it is an object of the present invention to provide a novel apparatus for measuring an immunity of electric and electronics devices to an electromagnetic wave interference, which is free from such problems as described above.

It is a further object of the present invention to provide a novel apparatus for measuring an electromagnetic stress of electric and electronics devices, which is able to ascertain precisely a position at which an abnormal operation appears.

The above and other objects, features and advantages of the present invention will be apparent from the following descriptions.

The invention provides an apparatus for measuring an electromagnetic wave stress of an article. The apparatus includes an electromagnetic wave irradiation unit comprising a plurality of radiation probes arranged adjacent to each other and approximately along a surface of the article at least on one side thereof so as to permit the probes to irradiate independently electromagnetic waves on divided local areas in a surface of the article and the divided local areas corresponding to the probes. The apparatus also includes an oscillator unit for generating electromagnetic wave signals to be used for excitations of the radiation probe. The apparatus also includes a transmitter unit being electrically connected to both the signal generating unit and the radiation probes for receiving the electromagnetic wave signals from the signal generating unit and subsequently transmitting the electromagnetic wave signals to the radiation probes. The apparatus also includes a control unit being electrically connected to the article for receiving output signals having information as to existences of any abnormalities in individual divided local areas in said article exposed to an electromagnetic wave irradiation, the control unit being electrically connected to the transmitter unit to control independently an excitation of each of the radiation probes.

The probes may be arranged in matrix in opposite sides of the article. The same number of the probes may be provided on opposite sides of the article for form a plurality of pairs of the probes being arranged in approximately symmetrical positions in opposite sides of the article. Alternatively, different numbers of the probes may be provided in asymmetrical positions on opposite sides of the article.

The probe may comprise an electrode plate having a face being approximately in parallel to the surface of the article. The probe may also cômprise a loop antenna having a loop face being approximately in parallel to the surface of the article. Further, the probe may comprise a loop antenna having a loop face being approximately perpendicular to the surface of the article. The probe may also comprise doubled loop antennas comprising a first loop antenna having a loop face being approximately in parallel to the surface of the article and a second loop antenna having a loop face being approximately perpendicular to the surface of the article. The probe may also comprise triplicated loop antennas comprising a first loop antenna having a loop face being approximately in parallel to the surface of the article, a second loop antenna having a loop face being approximately perpendicular to the surface of the article and a third loop antenna having a loop face being approximately perpendicular to both the faces of the first and second loop antennas. The probes may also comprise feeding points formed by a matrix arrangement of a plurality of linear antennas. The probes may also comprise feeding points formed by a matrix arrangement of a plurality of linear antennas. The probe may also comprise a loop antenna comprising a semiridged cable, a solid copper rod and a gap between the cable and the rod.

The transmitter unit may include an unbalanced/balanced conversion circuit being electrically connected to the oscillator unit, a first switching device being connected to the unbalanced/balanced conversion circuit and the control unit, a phase shifter being electrically connected to the control unit, the first switching device and the radiation probes arranged on one side of the article, and a second switching device being connected to the unbalanced/balanced conversion circuit, the control unit and the radiation probes being arranged on the opposite side of the article.

The control unit may control the transmitter unit so that the radiation probes irradiate electromagnetic waves sequentially one by one on the individual divided local areas in the article. The control unit may comprise a signal waveform processing unit being electrically connected to the article for receiving output signals having informations as to abnormalities from the article to subject the output signals to Furier transformation to obtain spectral signals in frequency. The control unit may further include a control section being electrically connected to the signal waveform processing unit for receiving the transformed spectral signals and subsequent comparison of the spectral signals with reference spectrums stored therein to find variations of the spectral signals from the reference signals so as to convert the variations into predetermined immunity levels.

The apparatus may further include a display unit being electrically connected to the control unit for receiving information as to the immunity levels and subsequent color display in which the individual immunity levels of the individual divided local areas are represented by different colors in the same number of corresponding divided blocks as the local areas.

BRIEF DESCRIPTION OF THE DRAWINGS

Preferred embodiments of the present invention will hereinafter be described in detail with reference to the accompanying drawings.

DETAILED DESCRIPTION OF THE PREFERRED EMBODIMENT

The invention provides an apparatus and method for measuring and evaluating an immunity to electromagnetic wave interferences for articles such as electronic and electric devices which tend to suffer any impact due to the electromagnetic wave interferences.

Preferred embodiments of the present invention will hereinafter fully be described in detail with reference to the accompanying drawings. The description will focus on a first embodiment of the present invention in which a novel apparatus for conducting an electromagnetic stress test is provided to measure and evaluate an immunity to electromagnetic wave or radio wave interferences for various articles such as electric and electronics devices which tend to suffer any impact of the electromagnetic wave or radio wave interferences.

Figure 1:
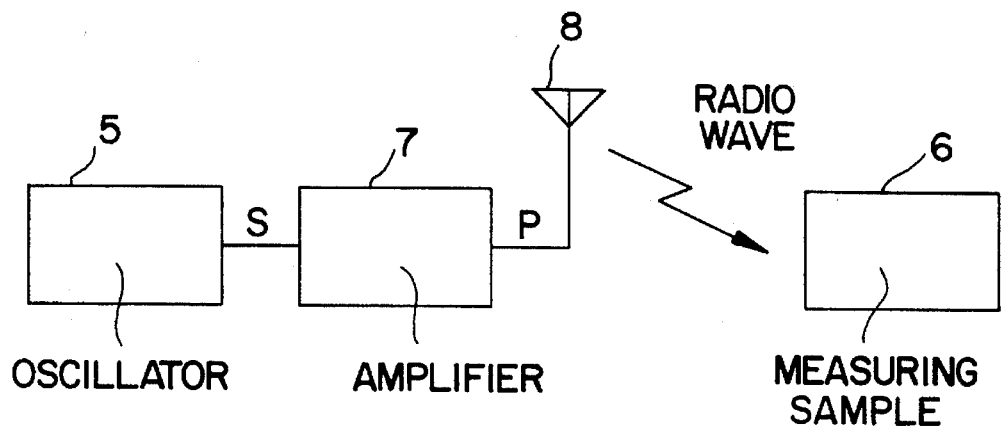
FIGS. 1 and 2 are diagrams illustrative of conventional immunity testing apparatuses.
Figure 2:
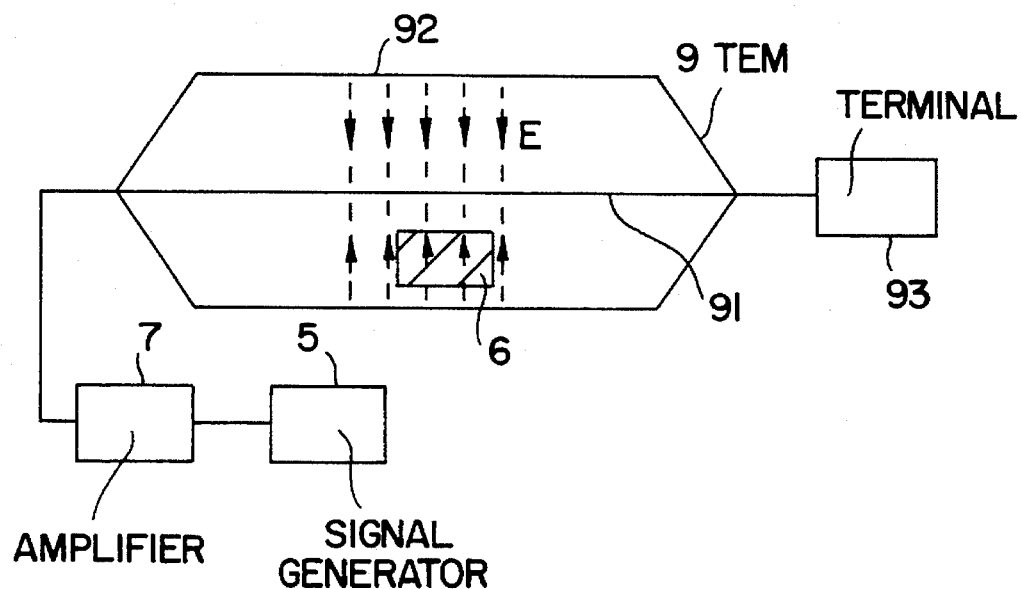
Figure 3:
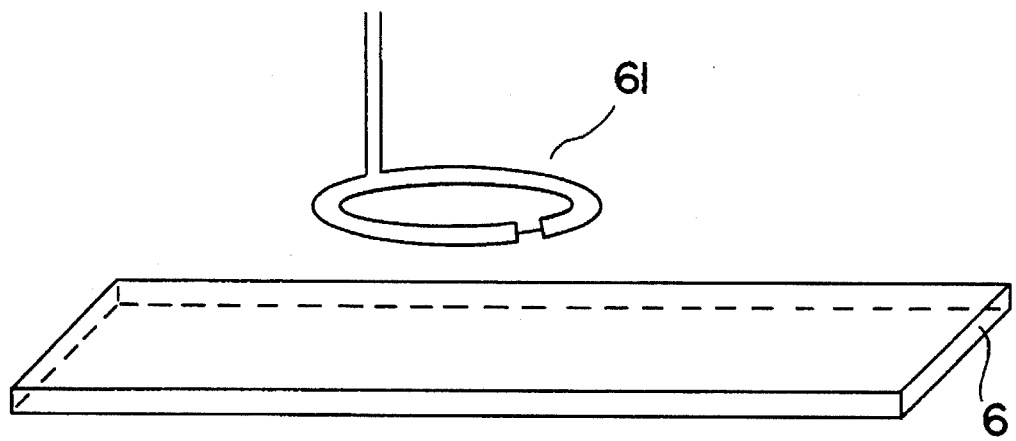
FIGS. 3 to 5 are diagrams illustrative of a radio wave irradiating test for a loop antenna radiating a radio wave to a measured sample.
Figure 4:
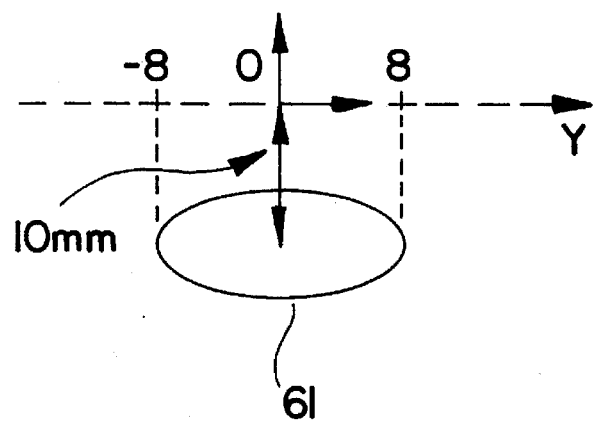
Figure 5:
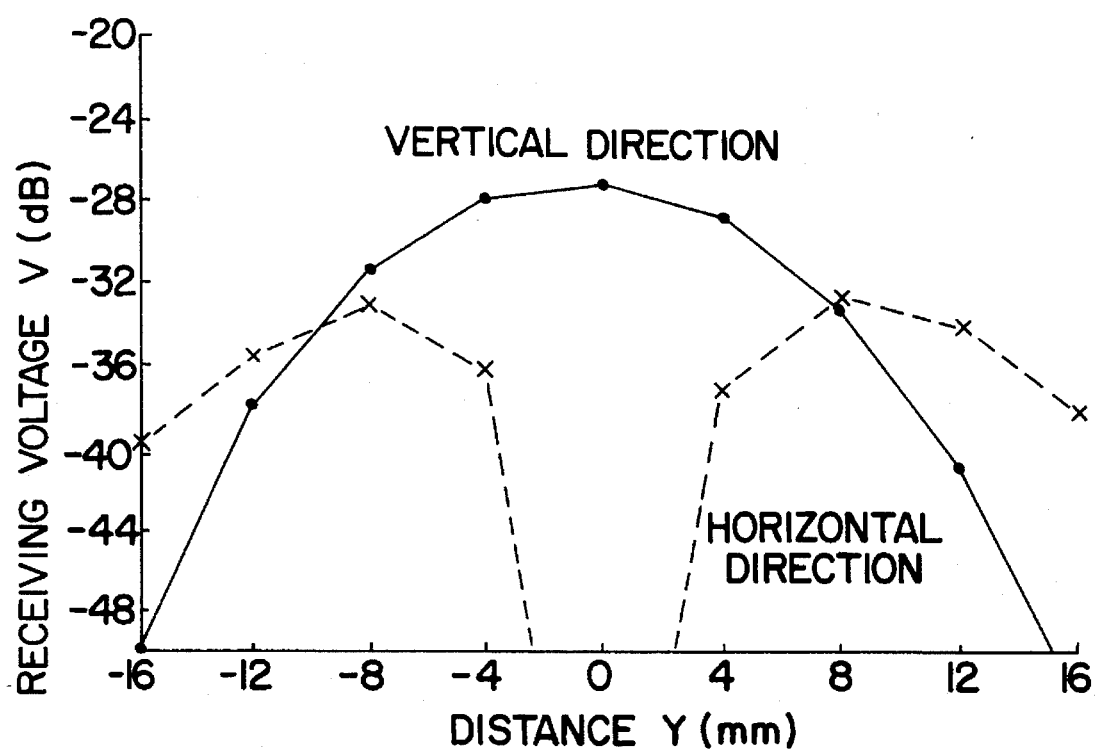
Figure 6:
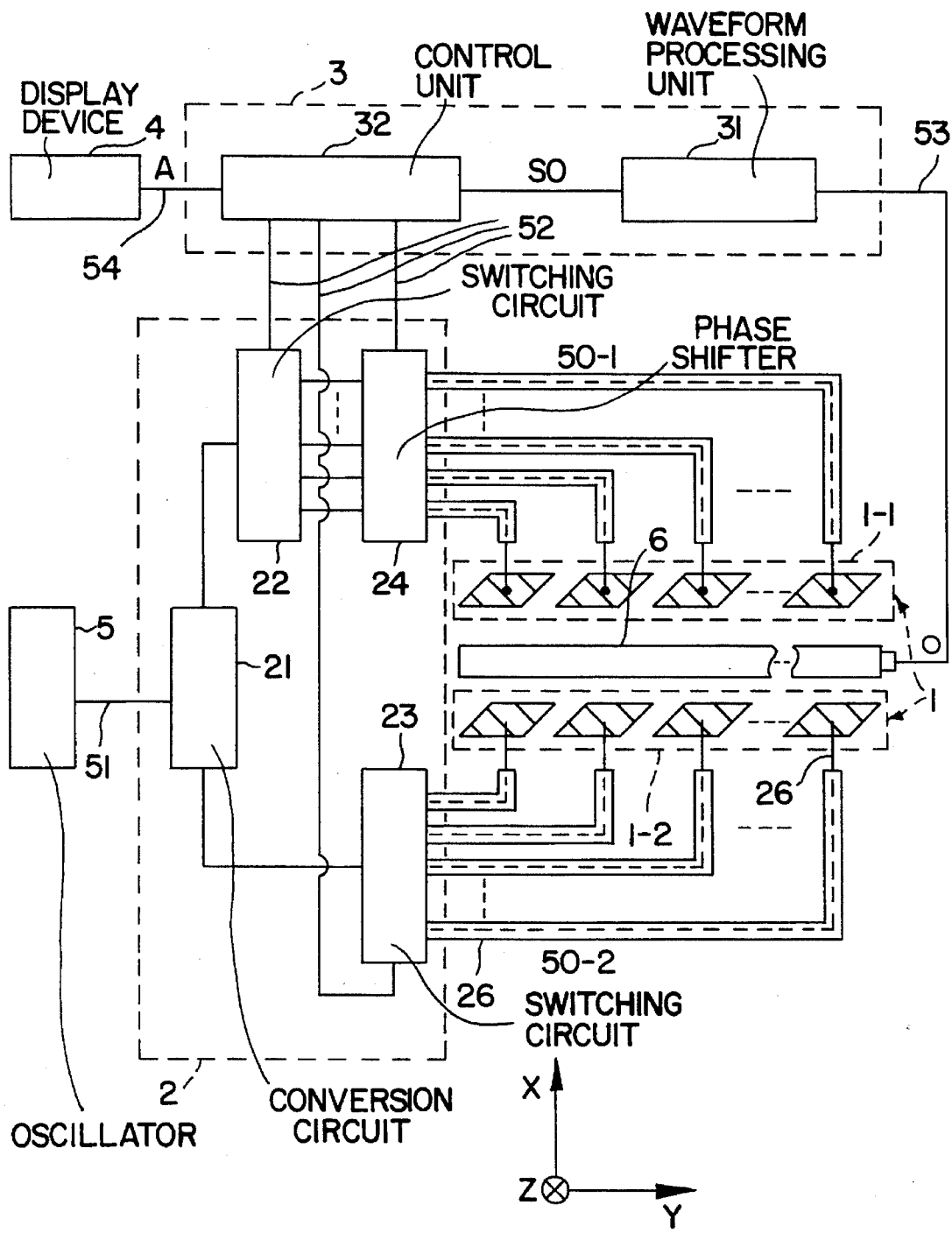
FIG. 6 is a diagram illustrative of an apparatus for measuring electromagnetic stress test for an article according to the present invention.

As shown in FIG. 6, the immunity testing apparatus includes an oscillator 5 for generating a radio wave frequency signal. The immunity testing apparatus also includes a transmitter unit 2 being electrically connected to the oscillator 5 through a coaxial cable 51 through which the radio wave frequency signal is transmitted from the oscillator 5 into the transmitter unit 2. The immunity testing apparatus also includes a radio wave irradiation unit 1 being electrically connected to the transmitter unit 2 through shielded transmission lines for fetching the transmitted frequency signals to irradiate a radio wave on a measured sample device 6 whose immunity is intended to be measured and evaluated. The radio wave is required to be irradiated on at least two sides of the measured sample device 6, preferably on opposite sides, for example, upper and bottom sides of the measured sample device 6. The immunity testing apparatus also includes a judgment unit 3 being electrically connected to the transmitter unit 2 through control signal transmission lines 52 on which control signals are transmitted from the judgment unit 3 into the transmitter unit 2 to control operation of the transmitter unit 2. The judgment unit 3 is also electrically connected to the measured sample device 6 at its output side through an output signal transmission line 53 so that the judgment unit 3 may fetch an output signal from the measured sample device 6 to obtain information as to existences of any abnormal state of the measured sample device 6 being exposed to the radio wave irradiated from the radio wave irradiation unit 1. The judgment unit 3 may convert the transmitted output signals representing information as to the abnormality of the measured sample device 6 into immunity signals. The judgment unit 3 is further electrically connected to a display device 4 through an immunity signal transmission line 54 on which the immunity signals are transmitted from the judgment unit 3 into the display device 4.

The transmitter unit 2 further includes an unbalanced/balanced conversion circuit 21, first and second switching circuits 22 and 23 and a phase shifter 24. The unbalanced/balanced conversion circuit 21 is electrically connected to the oscillator 5 through the coaxial cable 51 on which the radio wave frequency signal is transmitted from the oscillator 5 into the unbalanced/balanced conversion circuit 21. The unbalanced/balanced conversion circuit 21 may conduct the unbalanced/balanced conversion or may selected any one of the balanced and unbalanced circuits. The unbalanced/balanced conversion circuit 21 is further electrically connected to each of first and second switching circuits 22 and 23. Both the first and second switching circuits 22 and 23 are separated from each other through the unbalanced/balanced conversion circuit 21. The first switching circuit 22 is electrically connected through the phase shifter 24 to a first radio wave transmission line group 50-1. The second switching circuit 23 is electrically connected to a second radio wave transmission line group 50-2. Each of the first and second radio wave transmission line groups 50-1 and 50-2 includes the same number of shielded radio wave transmission lines, each of which comprises a wiring line 26 made of a conductive material such as copper and a shield 25 for shielding the wiring line 26.

Figure 7:
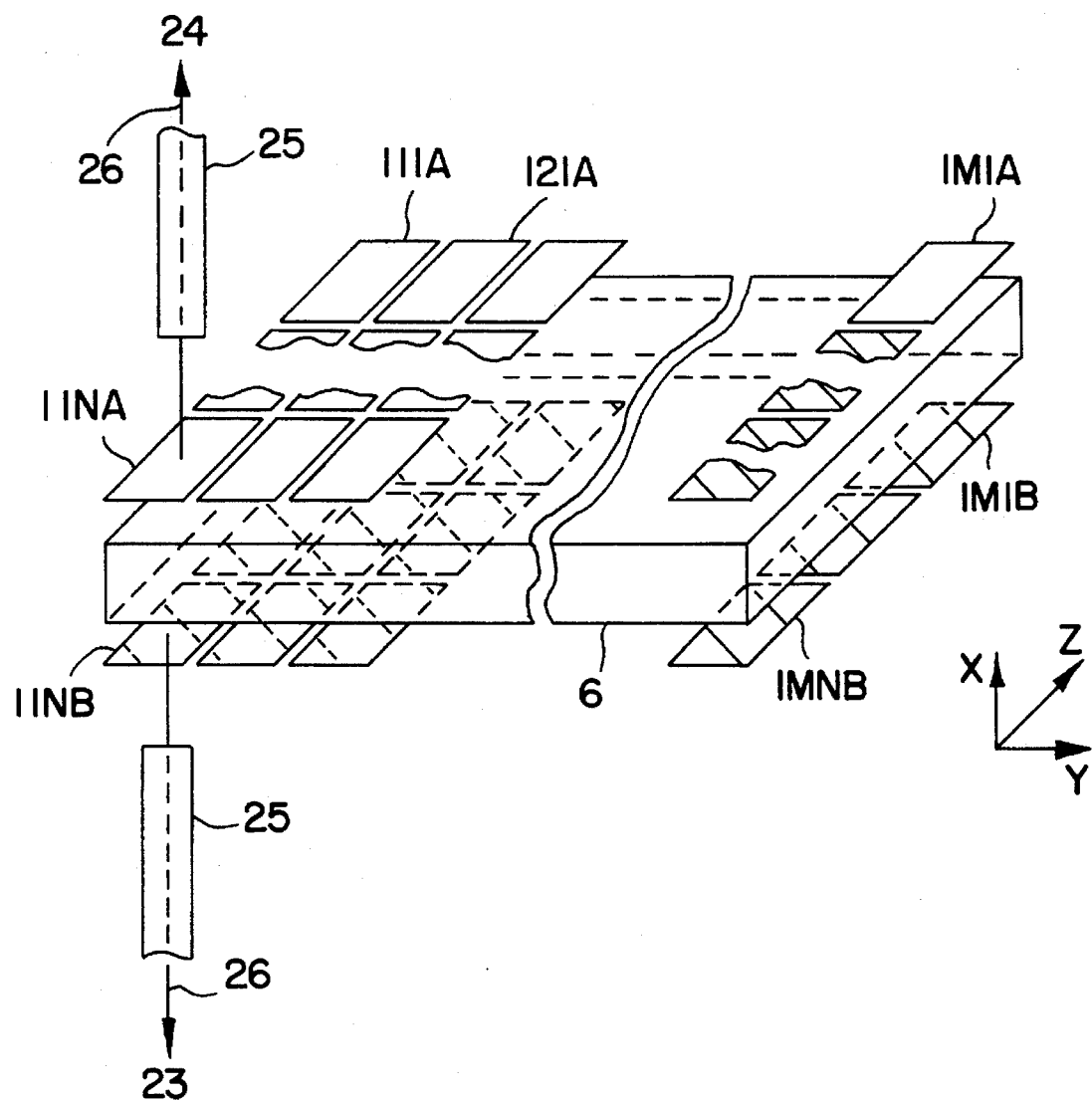
FIG. 7 is a schematic view illustrative of a radio wave irradiation unit involved in an immunity testing apparatus in a first embodiment according to the present invention.

The radio wave irradiation unit 1 may comprise first and second sections 1—1 and 1-2, both of which are placed to sandwich the measured sample device 6 at opposite sides, for example, upper and lower sides thereof. Each of the first and second sections 1—1 and 1-2 involved in the radio wave irradiation unit 1 may include the same number of radiation probes as each other. The radiation probes may be provided at opposite sides of the measured sample device 6 to make a plurality of pairs thereof. Namely, one of the radiation probes involved in the first section 1—1 and one of the radiation probes involved in the second section 1-2 may be provided at opposite sides of the measured sample device 6 to make a pair. Each of the radiation probes may comprise various probes, for example a metal plate facing a vertical direction to the surface of the measured sample device 6. Namely, the metal plate acting as the radiation probe is in parallel to the surface of the measured sample device 6. As illustrated in FIG. 7, a plurality of such pairs of the radiation probes may be arranged to form matrices at the opposite sides of and along the surface of the measured sample device 6. The radiation probes involved in the first section 1—1 may be provided separately from the radiation probes involved in the second section 1-2 as to allow for an insertion of the measured sample device 6 between the first and second sections 1—1 and 1-2. The paired radiation probes may be positioned to have a distance of approximately 2 cm.

Referring back to FIG. 6, each of the radiation probes involved in the first and second sections 1—1 and 1-2 in the radio wave irradiation unit 1 is connected to a respective transmission line involved in the first and second radio wave signal transmission line group 50-1 or 50-2. Each of the radiation probes involved in the first section 1—1 is electrically connected to each transmission line involved in the first radio wave signal transmission line group 50-1 which is further electrically connected to the phase shifter 24 involved in the transmitter unit 2. By contrast, each of the radiation probes involved in the second section 1-2 is electrically connected to each transmission line involved in the second radio wave signal transmission line group 50-2 which is further electrically connected to the switching circuit 23 involved in the transmitter unit 2. Each of the radiation probes involved in the radio wave irradiation unit 1 receives the radio wave signals transmitted from the transmitter unit 2 through the first and second radio wave signal transmission line groups 50-1 and 50-2 and subsequently radiates a radio wave having a predetermined wavelength to be irradiated on the measured sample device 6.

The measured sample device 6 has a signal output terminal. The measured sample device 6 makes an output of signals having information of whether the measured sample device 6 exposed to the radio wave is in any abnormal state. The signal output terminal of the measured sample device 6 is electrically connected to an output signal transmission line 53 which is further electrically connected to a signal input terminal of the judgment unit 3 to permit the output signals having informations as to any abnormal state or operation of the measured sample device 6 to be transmitted through the output signal transmission line 53 up to the input terminal of the judgment unit 3.

The judgment unit may comprise a signal waveform processing unit 31 and a control unit 32. The signal waveform processing unit 31 is electrically connected to the output signal transmission line 53 though the output terminal of the judgment unit 3 to receive the output signals having information as to any abnormal state of the measured sample device 6. Subsequently, the signal waveform processing unit 31 is able to subject the received output signals to a Fourier transformation so that the output signals having information as to any abnormal state of the measured sample device 6 are converted into frequency spectral signals.

The control unit 32 is electrically connected to the signal waveform processing unit 31 to allow the frequency spectral signals subjected to the Fourier transformation to be transmitted to the control unit 32. The control unit 32 receives the frequency spectral signals for subsequent comparative processing by comparing the frequency spectral signals with reference spectrums which have already been stored to find displacement or variations of the frequency spectral signals from the reference spectrums. Subsequently, the control unit 32 converts the variations of the frequency spectral signals into predetermined immunity level signals, the number of which is variable to match various conditions.

The control unit 32 is also electrically connected to the display device 4 through an immunity level signal transmission line 54 to transmit the immunity level signals to the display device 4. The display device 4 receives the immunity level signals to show a color display in which each color corresponds to each immunity level.

The control unit 32 involved in the judgment unit 3 is also electrically connected to the transmitter unit 2 to control the operations of the transmitter unit 2. For example, the control unit 32 is electrically connected to the first and second switching circuits 22 and 23 as well as the phase shifter 24 to control operations of the individuals. The controls by the control unit 32 to the first and second switching circuits 22 and 23 as well as the phase shifter 24 may lead to the controls of radiating operations of the probes involved in the radio wave irradiation unit 1.

The description of the invention will be directed toward operations of the immunity testing apparatus as described above. The measured sample 6 such as a printed circuit board is set between the first and second sections 1—1 and 1-2 of the radio wave irradiation unit 1. The control unit 32 involved in the judgment unit 3 supplies control signals to the first and second switching circuits 22 and 23 so that the first and second switching circuits 22 and 23 selects one of the radio wave signal transmission lines involved in the first and second transmission line groups 50-1 and 50-2 respectively, wherein each selected one of the radio wave signal transmission lines is electrically connected to each of the radiation probes which make a pair with one another. Namely, the control unit 32 may control the first and second switching circuits 22 and 23 to select sequentially one by one the paired radiation probes involved in the first and second sections 1—1 and 1-2 provided in the opposite sides of the measured sample device 6.

The selected pair of the radiation probes receives radio wave signals which have been transmitted from the oscillator 5 through the unbalance/balance conversion circuit 21 and the first and second switching circuits 22 and 23 in addition the phase shifter 24 as well as through the selected two radio wave signal transmission lines, both of which are involved in the first and second transmission line groups 50-1 and 50-2 respectively. Now it is assumed that the selected pair of the radiation probes comprises the radiation probes 11NA and 11NB as illustrated in FIG. 7. In this case, the selected radiation probes only radiate a radio wave along an X direction vertical to the surface of the measured sample device 6. Namely, the selected pair of the radiation probes applies an electric field along the X direction vertical to the surface of the measured sample device 6. When the paired radiation probes 11NA and 11NB are selected by the control unit 32 involved in the judgment unit 3, the radio wave is locally irradiated on a part of the measured sample device 6, which is sandwiched between the selected pair of the radiation probes 11NA and 11NB. This part of the measured sample device, which is exposed to the radio wave irradiation, is subjected to a measurement of immunity or to immunity test to confirm whether or not this part of the measured sample device 6 is in an abnormal state. The radio wave radiated from the paired radiation probes may have various frequencies in the range of from 30 MHz to 1000 MHz. As described above, the paired radiation probes are provided to have a distance of approximately 2 cm from one another. Then, the radio wave to be irradiated on the measured sample device 6 has an extremely large wavelength as compared to the distance between the paired radiation probes which are provided at the opposite sides of the measured sample device 6. In such a case, the electric field between the paired radiation probes may approximately be regarded as an electrostatic field.

As described above, the control unit 32 involved in the judgment unit 3 selects sequentially one by one the paired radiation probes to subject in turn local part of the measured sample device 6 to the radio wave irradiation so as to confirm whether or not each of the local parts sandwiched between the paired radiation probes in the measured sample device 6 is in an abnormal state.

Alternatively, the control unit 32 involved in the judgment unit 3 may select any adjacent two radiation probes which are disposed on the same side of the measured sample device 6. Namely, the control unit 32 may select two adjacent radiation probes, both of which are in the first or second section 1—1 or 1-2. In this case, the electric field is applied between the selected two adjacent radiation probes. Then, the measured sample device 6 is locally exposed to a radio wave irradiation or an electric field in parallel to the surface of the measured sample device 6. The electrical field to be applied to the measured sample device 6 has a component of the Y-direction.

Figure 8:
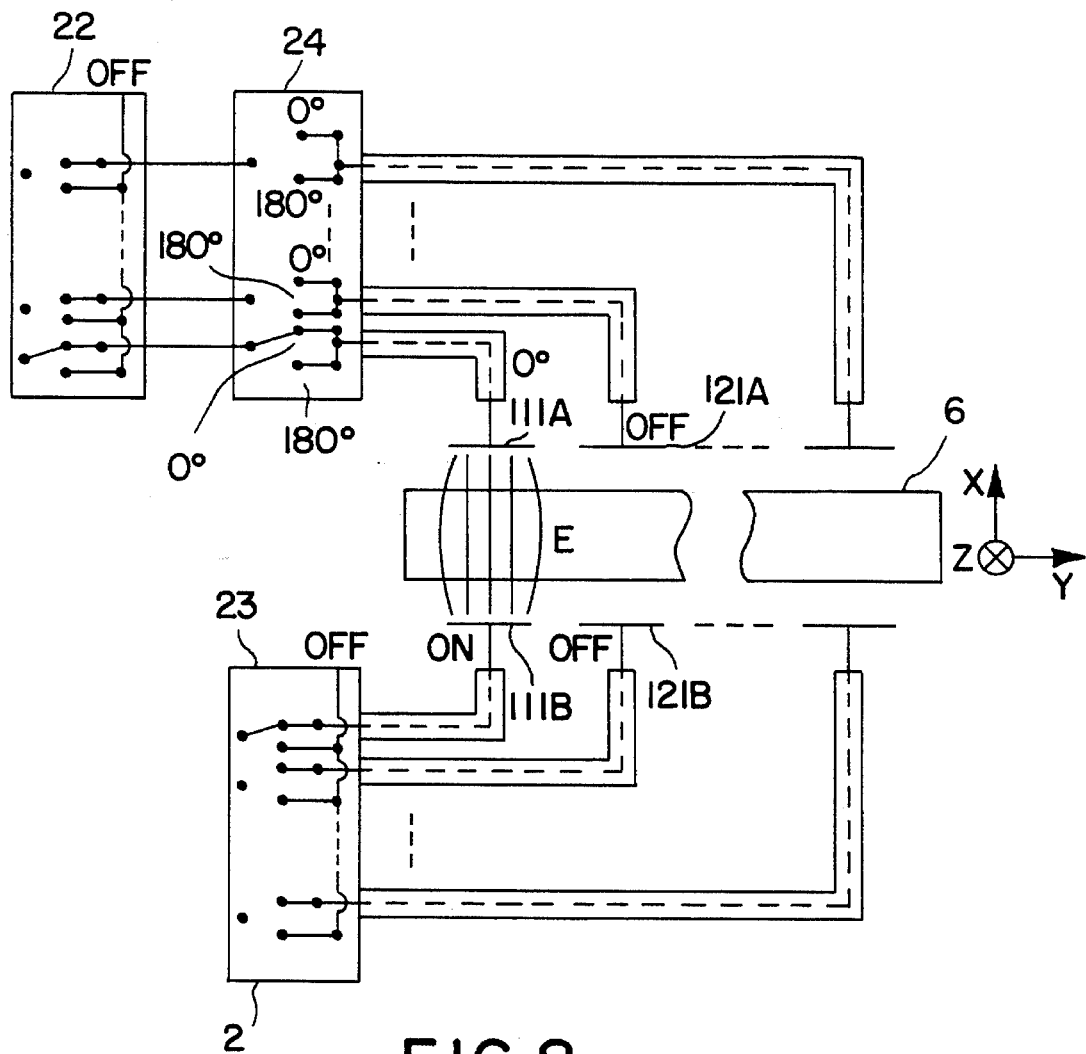
FIGS. 8 and 9 are diagrams illustrative of operations of a radio wave irradiation unit involved in an immunity testing apparatus in a first embodiment according to the present invention.

As illustrated in FIG. 8, the control unit 32 involved in the judgment unit 3 may control the first and second switching circuits 22 and 23 to supply the radiation signals to one pair of the radiation probes which are provided at the opposite sides of the measured sample device 6 so as to place the selected pair of the radiation probes 111A and 111B only in ON state and then the remaining radiation probes in OFF state. Then, the selected pair of the radiation probes 111A and 111B in ON state may radiate a radio wave or may apply an electric field to the local part sandwiched thereby involved in the measured sample device 6 wherein the electric field has a component of the X direction vertical to the surface of the measured sample device 6. The measured sample device 6 at the remaining part not sandwiched by the selected pair of the radiation probes 111A and 111B is neither exposed to any radio wave irradiation nor applied with any electric field. In this case, the phase shifter 24 selects 0°. This is able to ascertain whether or not the local part in the measured sample device 6 exposed to the radio wave or applied with the electric field in the X direction falls into any abnormal state. The above operation will be repeated until all pairs of the radiation probes have been selected by the control unit 32 to confirm whether or not every local part in the measured sample device 6 would be in any abnormal state.

Figure 9:
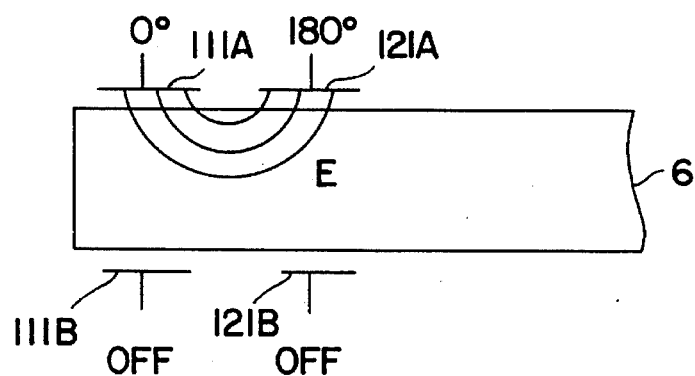

Alternatively, as illustrated in FIG. 9, the control unit 32 involved in the judgment unit 3 may further control the first and second switching circuits 22 and 23 to supply the radiation signals to two adjacent radiation probes which are involved in the first or second sections 1—1 and 1–2 to place the selected two adjacent radiation probes 111A and 121B only in ON state and then the remaining radiation probes in OFF state. Then, the selected two adjacent radiation probes 111A and 111B in ON state may radiate a radio wave or may apply an electric field to the local part sandwiched thereby involved in the measured sample device 6 wherein the electric field has a component of the Y direction parallel to the surface of the measured sample device 6. The measured sample device 6 at the remaining part not overlaid by the selected two adjacent radiation probes 111A and 121B is neither exposed to any radio wave irradiation nor applied with any electric field. In this case, the phase shifter 24 selects 0° for the radiation probe 111A and 180° for the radiation probe 121A to allow the selected two adjacent radiation probes 111A and 121A to have different phases to each other by 180°. This is able to ascertain whether or not the local part in the measured sample device 6 exposed to the radio wave or applied with the electric field in the Y direction falls into any abnormal state. The above operation will be repeated until any combination of adjacent two radiation probes have been selected by the control unit 32 to confirm whether or not every local part in the measured sample device 6 would be in any abnormal state.

Referring back to FIG. 6, informations of whether or not individual local parts in the measured sample device 6 would be in any abnormal state appear as electrical signals. The electrical signals having information as to any abnormal state of individual local parts are outputted through the output terminal of the measured sample device 6 and then through the output signal transmission line 53 to the signal waveform processing unit 31 involved in the judgment unit 3.

Figure 10A:
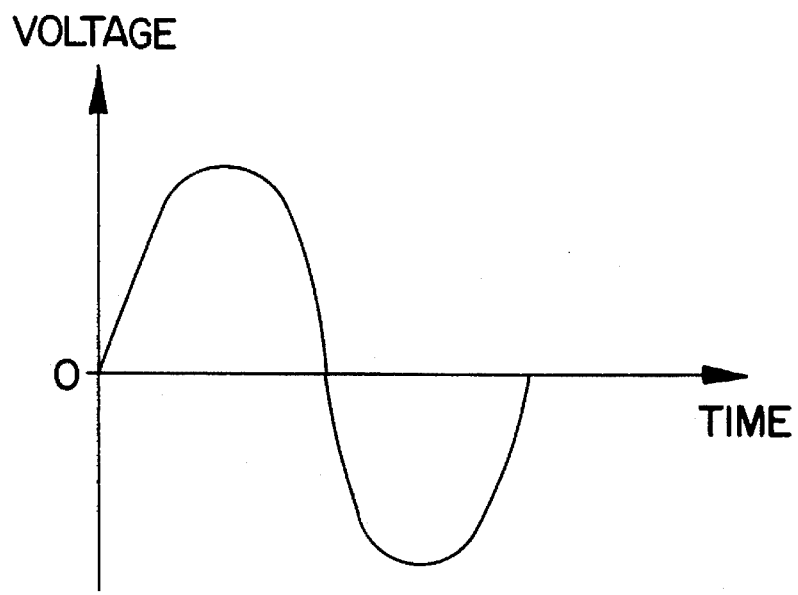
FIGS. 10A to 10D are diagrams illustrative of signal processing of output signals from a measured sample exposed to a radio wave.
Figure 10B:
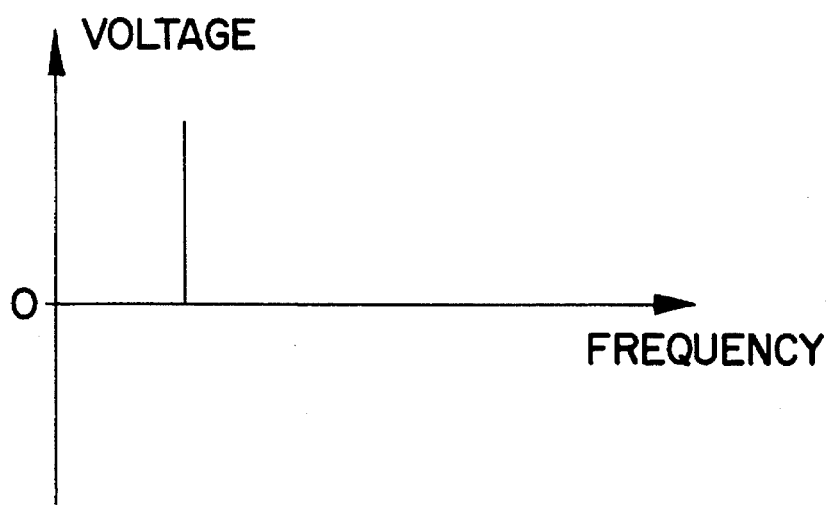

Referring to FIGS. 10A to 10D, the signal waveform processing unit 31 involved in the judgment unit 3 sequentially receives the transmitted signals having information of whether or not individual local parts in the measured sample device 6 would be in any abnormal state. Then, the signal waveform processing unit 31 sequentially subjects the signals having information as to any abnormal state to the Fourier transformation. If the signal from the local parts in the measured sample device 6 is of the normal state, the signal has a sine waveform as illustrated in FIG. 10A. When this signal is subjected to the Fourier transformation, one frequency component is included in the signal as illustrated in FIG. 10B. This represents that the measured local part involved in the measured sample device 6 would be in the normal state or is able to show the normal operation.

Figure 10C:
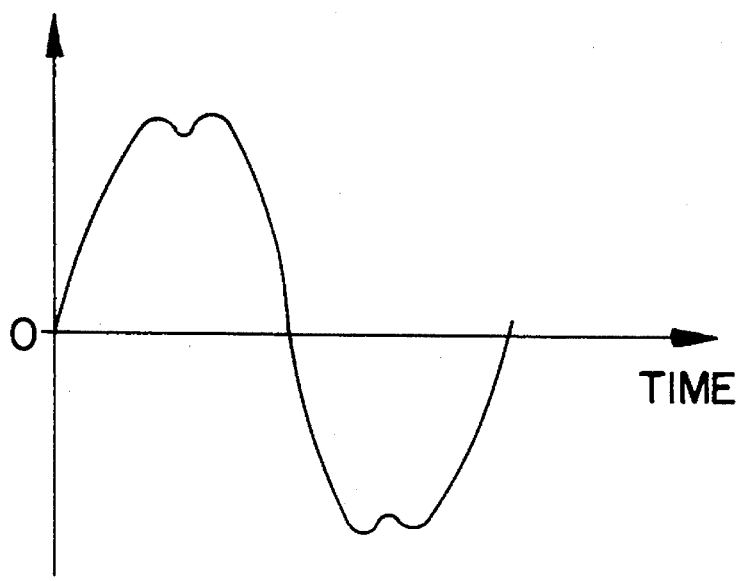
Figure 10C:
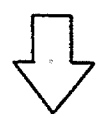
Figure 10D:
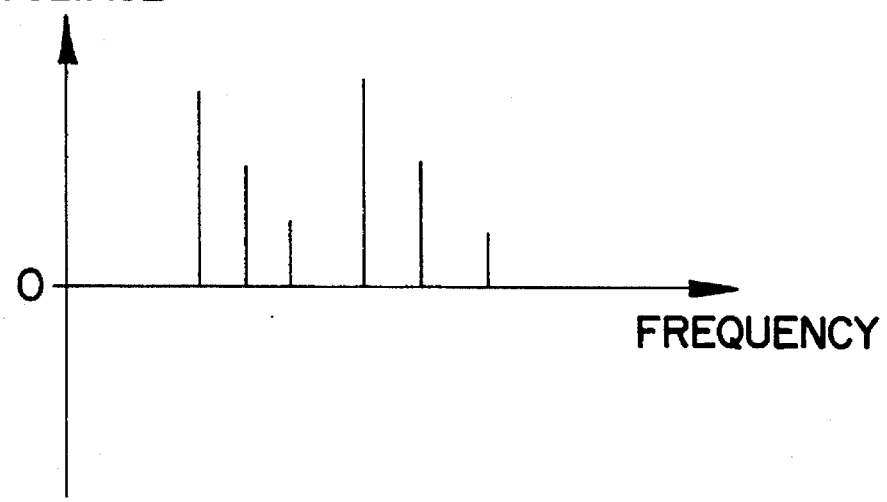

By contrast, when the signal from the local parts in the measured sample device 6 is of an abnormal state, the signal has a complicated waveform as illustrated in FIG. 10C. By subjecting the signal of the complicated waveform to the Fourier transformation, it is appreciated that the signal has two or more different frequency components as illustrated in FIG. 10D. This indicates that the measured local part involved in the measured sample device 6 would be in the abnormal state or shows an abnormal operation.

As described above, the signals having information of whether or not individual local parts in the measured sample device 6 would be in any abnormal state are transformed by the Fourier transformation into the spectral signals as illustrated in FIGS. 10B and 10D. The spectral signals having information of whether or not individual local parts in the measured sample device 6 would be in any abnormal state are then subjected to a comparative processing by the control unit 32 with the reference spectrums which have already been stored, to find variations of the spectral signals from the reference spectrums. The variations of the spectral signals from the reference signals are then converted into immunity levels. The number of the immunity levels are variable. In this embodiment, the immunity levels are classified into six levels, for example, immunity levels 0 to 5.

The spectral signals having a variation from the reference spectrums means that the measured local part of the sample device 6 was in an abnormal state. A large variation of the spectral signals from the reference spectrums means a large abnormality of the measured local part of the sample device 6.

Each level of the reference spectrums may be so set as to correspond to each level of the spectral signals having informations as to the abnormality. In this case, no variation of the spectral signals from the reference spectrums falls into the level 0. A variation less than 20% of the spectral signals from the reference spectrums falls into the level 1. A variation of 20% or more but less than 40% of the spectral signals from the reference spectrums falls into the level 2. A variation of 40% or more but less than 60% of the spectral signals from the reference spectrums falls into the level 3. A variation of 60% or more but less than 80% of the spectral signals from the reference spectrums falls into the level 4. A variation from 80% to 100% of the spectral signals from the reference spectrums falls into the level 5. Namely, the immunity level 5 represents a largest abnormality of the measured local part of the sample device 6. The immunity level 0 represents no abnormality of the measured local part of the sample device 6.

Otherwise, if each level of the spectral signals having information as to the abnormality does not correspond to each level of the reference spectrums, rates as to individual levels of the spectral signals are found by averaging degrees of the individual levels of the spectral signals. The averaged spectral signals are also subjected to the comparative processing by the control unit 32 with the reference spectrums to find variations of the spectral signals from the reference spectrums. The variations of the spectral signals from the reference signals are then converted into the immunity levels as described above.

Referring back to FIG. 6, informational signals as to the immunity levels of the individual local parts in the measured sample device 6 are then transmitted from the control unit 32 through the immunity signal transmission line 54 to the display device 4. The display device conducts a color display. The above individual immunity levels 0 to 5 may be represented by various colors on the display device 4. In this embodiment, no color represents the immunity level 0. Light blue represents the immunity level 1. Blue represents the immunity level 2. Yellow represents the immunity level 3. Vermilion represents the immunity level 4. Red represents the immunity level 5. Namely, the red color represents a largest abnormality of the measured local part of the sample device 6. No color represents no abnormality of the measured local part of the sample device 6.

Figure 11:
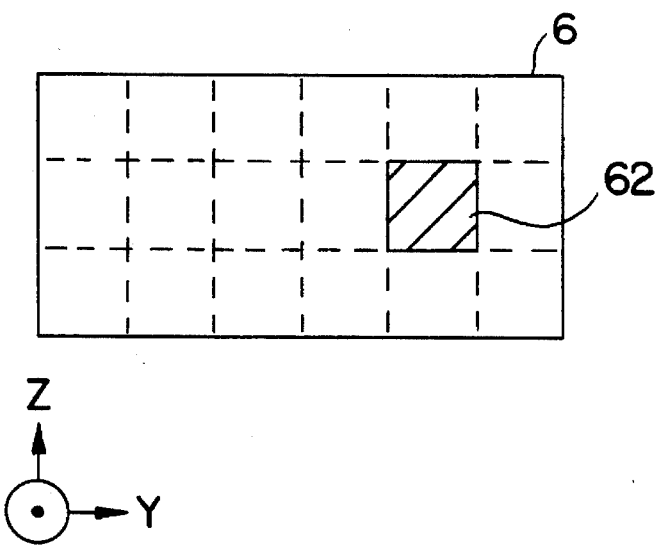
FIG. 11 is a view illustrative of a picture displayed on a screen of a display involved in an immunity testing apparatus according to the present invention.

As illustrated in FIG. 11, the display device 4 conducts the color display of the immunity levels of the individual local parts in the measured sample device 6. On the display screen, displayed are colored matrix sections which correspond to the matrix of the individual local parts of the measured sample device 6. Individual immunity levels of the local parts of the measured sample device 6 are represented at the corresponding individual matrix sections. For example, the red colored section 62 on the display screen represents that the corresponding local part of the measured sample device 6 had a considerable abnormality and this local part has a less immunity to the radio wave interference or to the electromagnetic interference.

From the above descriptions, it could readily be understood that the novel apparatus sequentially measures one by one the immunities or the electromagnetic stress of the individual local parts in the measured sample device to ascertain a position at which the measured sample device exposed to the radio wave irradiation shows an abnormal operation as well as to obtain informations as to the degree of the abnormality thereof, in addition to ascertain which element involved in the measured sample device has insufficient immunity or insufficient electromagnetic stress.

For the immunity test, it is possible to turn all of the radiation probes ON at first for radio wave irradiations on the entire surface of the measured sample device for subsequent sequential measurement for the immunities or the electromagnetic stress of the individual local parts in the measured sample device which includes any abnormality.

A second embodiment of the present invention will be described in which a novel apparatus for conducting an electromagnetic stress test is provided to measure and evaluate an immunity to electromagnetic wave or radio wave interferences for various articles such as electric and electronics devices which tend to suffer any impact of the electromagnetic wave or radio wave interferences.

The novel apparatus for measuring the immunity or the electromagnetic stress provided in the second embodiment has the same structure as the structure of the apparatus in the first embodiment as described above, except for the arrangement of the radiation probes. The descriptions of the second embodiment according to the present invention will focus only on the structural difference of the apparatuses between the first and second embodiments namely on the arrangement of the radiation probes.

Figure 12:
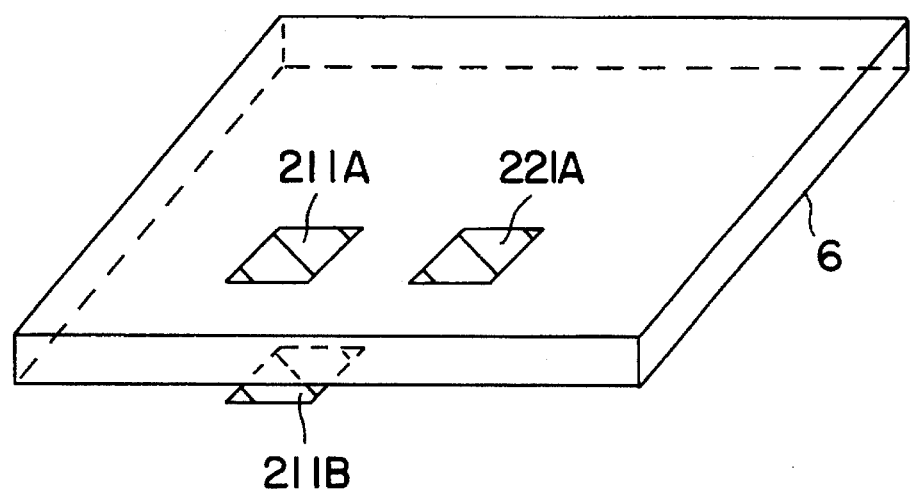
FIG. 12 a schematic view illustrative of a radio wave irradiation unit involved in an immunity testing apparatus in a second embodiment according to the present invention.
Figure 12:
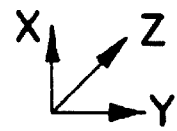

The arrangement of the radiation probes is as illustrated in FIG. 12. As could be understood from FIG. 12, the radio wave irradiation unit 1 comprises a plurality of triplets of radiation probes, one of which is illustrated in FIG. 12 as radiation probes 211A, 221A and 211B. The radio wave irradiation unit 1 comprises the first and second sections 1—1 and 1-2 as illustrated in FIG. 6. The radiation probes 211A and 211A are involved in the first section 1—1 of the radio wave irradiation unit 1, while the radiation probe 211B is involved in the second section 1-2 of the radio wave irradiation unit 1. Each triplicated radiation probes comprises two adjacent radiation probes provided at one side of the measured sample device and an opposite radiation probe provided at the opposite side of the measured sample device so that the opposite radiation probe and any one of the adjacent two radiation probes are positioned at symmetrical positions against a plane along the surface of the measured sample device 6. Namely, each triplet of the radiation probes may be regarded as comprising a horizontal combination of the adjacent two radiation probes provided along the surface of the measured sample device 6 and a vertical combination of one of the adjacent two radiation probes with the opposite radiation probe arranged at the symmetrical positions to the plane along the surface of the measured sample device 6. The horizontal combination of the adjacent two radiation probes involved in each of the triplet is to apply a local part of the measured sample device with an electric field having a horizontal component or an electric field in the Y-direction horizontal to the surface of the measured sample device 6. By contrast, the vertical combination of the opposite radiation probe with one of the adjacent two radiation probes involved in each of the triplet is to apply a local part of the measured sample device with an electric field having a vertical component or an electric field in the X-direction vertical to the surface of the measured sample device 6.

The novel apparatus for measuring the immunity or the electromagnetic stress of the measured sample device are as illustrated in FIG. 6. When the control unit 32 controls the switching circuits 22 and 23 involved in the transmitter unit 2 to turn the radiation probes 211A and 221A ON and the remaining radiation probes OFF, an electric field having the horizontal component is applied to the local part of the measured sample device 6. If the control unit 32 controls the switching circuits 22 and 23 to turn the radiation probes 211A and 211B ON and the remaining radiation probes OFF, an electric field having the vertical component is applied to the local part of the measured sample device 6.

The measurement of the immunity of the measured sample device 6 may be carried out by placing sequentially one by one the plural triplet of the radiation probes in ON state as described in the first embodiment.

Although in the first and second embodiments the radiation probes comprises probes for applying the electric field having either the horizontal or vertical component to the surface of the measured sample device 6, the radiation probe may comprise a probe for applying a magnetic field having either the horizontal or vertical component to the surface of the measured sample device 6.

A third embodiment of the present invention will be described in which a novel apparatus for conducting an electromagnetic stress best is provided to measure and evaluate an immunity to electromagnetic wave or radio wave interferences for various articles such as electric and electronics devices which tend to suffer any impact of the electromagnetic wave or radio wave interferences.

The novel apparatus for measuring the immunity or the electromagnetic stress provided in the third embodiment has the same structure as the structure of the apparatus in the first embodiment as described above, except for the radiation probes. The descriptions of the third embodiment according to the present invention will focus only on the structural difference of the radiation probes between the first and third embodiments. A structural difference of the apparatus of the third embodiment from that of the first embodiment appears on the radiation probe.

Figure 13:
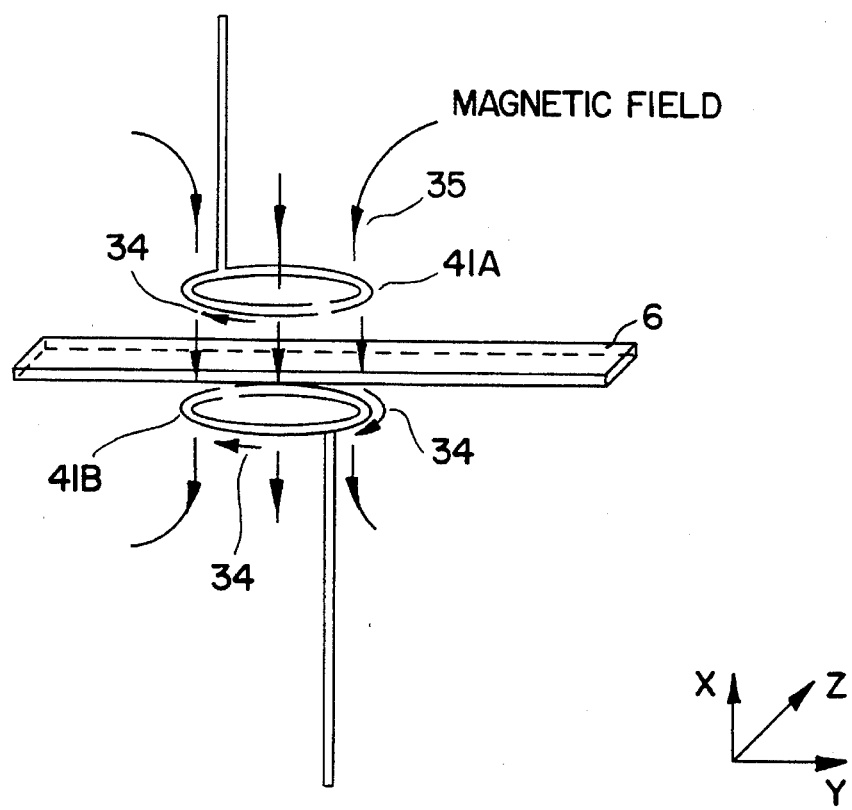
FIG. 13 a schematic view illustrative of a radio wave irradiation unit involved in an immunity testing apparatus in a third embodiment according to the present invention.

FIG. 13 represents the structure of the radiation probe involved in the radio wave irradiation unit 1 involved in the apparatus of the third embodiment according to the present invention. Each of the radiation probes may comprise a shielded circular loop antenna probe, whose loop surface faces in the vertical direction to the surface of the measured sample device 6. The radio wave irradiation unit 1 involved in the immunity testing apparatus may comprise a plurality of pairs of the shielded circular loop antenna probes which are arranged at opposite sides of the measured sample device 6. Individual paired shielded circular loop antenna probes are arranged at symmetrical positions to a plane parallel to the surface of the measured sample device 6 where the loop surface of each of the paired loop antenna probes faces in vertical to the surface of the measured sample device 6 as illustrated in FIG. 13. An excitation of the loop antenna probe 41A provided at the one side of the measured sample device 6 is carried out to synchronize with an excitation of the loop antenna probe 41B provided at the opposite side of the measured sample device 6. The electrical current flowing through the loop portion of the loop antenna probe may cause a magnetic field having a vertical component to the loop face of the loop antenna probe. Direction of electrical currents flowing through the loop portion are the same between the paired loop antenna probes 41A and 41B provided at the opposite sides of the measured sample devices 6. The synchronized excitations of the paired loop antenna probes in which the electrical currents flow through the loop portion the same direction, as labeled by arrows 34 may apply a magnetic field having a vertical component to the surface of the measured sample device 6 to a cylindrical space defined by the loop portions of the paired loop antenna probe in which the direction of the magnetic field is directed from the loop antenna probe 41A to the loop antenna probe 41B. The synchronized excitations with the electrical currents flowing through the loop portions of the paired loop antenna probes in the same direction leads to a superposition of the magnetic fields caused by the loop antenna probes 41A and 41B but only the vertical components thereof, while horizontal components of the magnetic fields are canceled by each other. Then, the measured sample device 6, at an area surrounded by the loops of the antenna probes, is applied with the magnetic field having almost only the vertical component. This could be understood from FIGS. 14A to 14C.

Figure 14A:
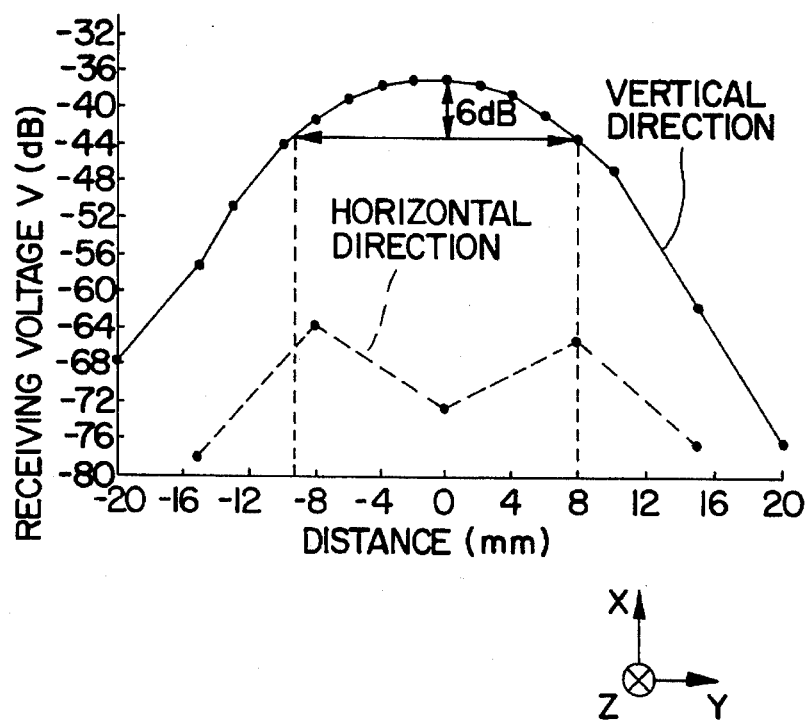
FIGS. 14A to 14C are diagrams illustrative of operations of a radio wave irradiation unit involved in an immunity testing apparatus in a third embodiment according to the present invention.
Figure 14B:
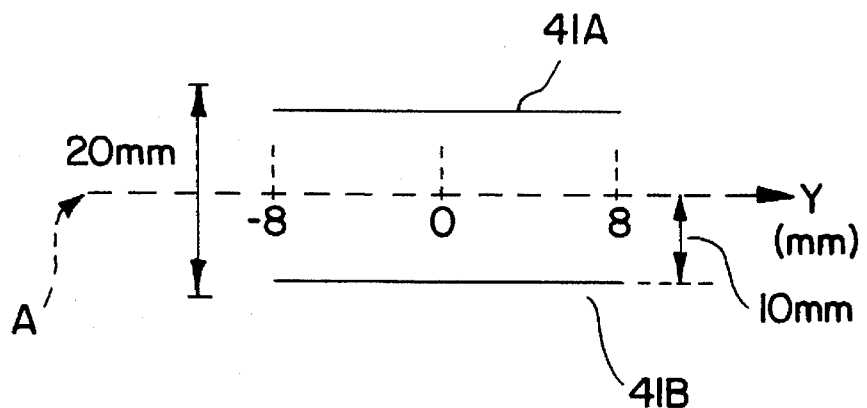
Figure 14C:
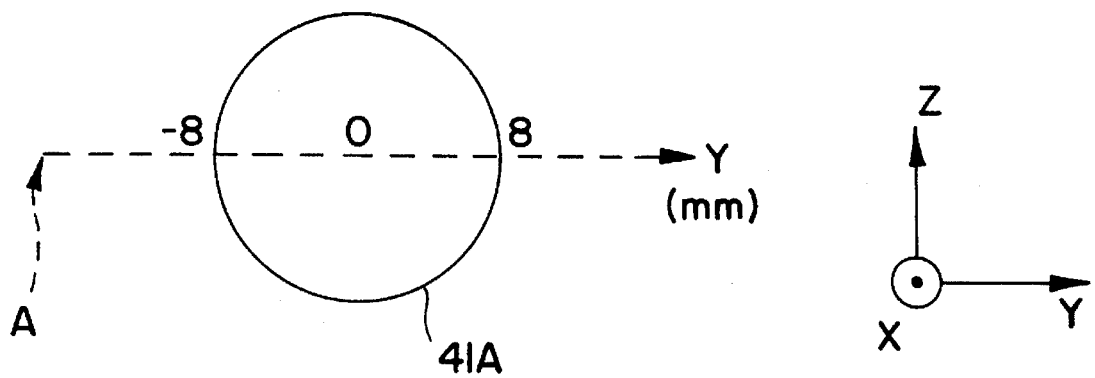

FIG. 14A represents the measurement results of the vertical and horizontal components of the superpositioned magnetic field caused by the paired loop antenna probes. In the measurement, the paired loop antenna probes 41A and 41B are separately positioned at a distance of 20 mm with their loops facing to each other and in parallel to the surface of the measured sample device 6. The loop portions of the loop antenna probes have a diameter of 16 mm as illustrated in FIGS. 14B and 14C. A small measuring loop probe is used. The measurements of the magnetic field in both the vertical and horizontal directions are carried out by sweeping the measuring small loop probe in which the measuring small loop probe is moved along a center line A between the paired loop antenna probes 41A and 41B and in a parallel direction to the loop faces of the paired loop antenna probes. The center line A, on which the measuring small loop probe is moved for sweeping, is the same direction as the Y-direction.

In FIG. 14A, the solid line represents a vertical component of the measured magnetic field, while the broken line represents a horizontal component of the measured magnetic field. Both components are represented as the intensity of the receiving voltages of the measuring small loop probe. The vertical component of the measured magnetic field is increased as the measuring small probe achieves a center position of the loop portion of the loop antenna probe and has the maximum value in the vicinity of the center position of the loop portion. The vertical component of the measured magnetic field is reduced as the measuring small loop probe becomes far from the center position of the loop portion. Within an area surrounded by the loop portion of the loop antenna probe, the vertical component of the magnetic field is held to be high values. By contrast, the horizontal component of the magnetic field is held to be low values in the average during the sweep by the measuring small loop probe. It is important that the horizontal component of the measured magnetic field is held to be lower values as compared to the vertical direction within the area surrounded by the loop portion of the loop antenna probe. Accordingly, the magnetic field applied in the area surrounded by the loop portion of the loop antenna probe may approximately be regarded as to have the vertical component only.

In the radio wave irradiation unit 1, the loop antenna probes are arranged in a matrix adjacent to each other. Accordingly, the measured sample device 6 is applied with the magnetic field having almost only the vertical component. In the third embodiment, the novel apparatus for measuring the immunity or the electromagnetic stress of the measured sample device is as illustrated in FIG. 6. When the control unit 32 controls the switching circuits 22 and 23 involved in the transmitter unit 2 to turn the loop antenna probes 41A and 41B ON and the remaining loop antenna probes OFF, an electric field having the vertical component is applied to the local part of the measured sample device 6. The measurement of the immunity of the measured sample device 6 may be carried out by placing sequentially one by one the plural pairs of the radiation probes in ON state as described in the first embodiment.

A fourth embodiment of the present invention will be described in which a novel apparatus for conducting an electromagnetic stress test is provided to measure and evaluate an immunity to electromagnetic wave or radio wave interferences for various articles such as electric and electronics devices which tend to suffer any impact of the electromagnetic wave or radio wave interferences.

The novel apparatus for measuring the immunity or the electromagnetic stress provided in the fourth embodiment has the same structure as the structure of the apparatus in the first embodiment as described above, except for the radiation probes. The descriptions of the third embodiment according to the present invention will focus only on the structural difference of the radiation probes between the first and fourth embodiments. A structural difference of the apparatus of the fourth embodiment from that of the first embodiment appears on the radiation probe.

Figure 15:
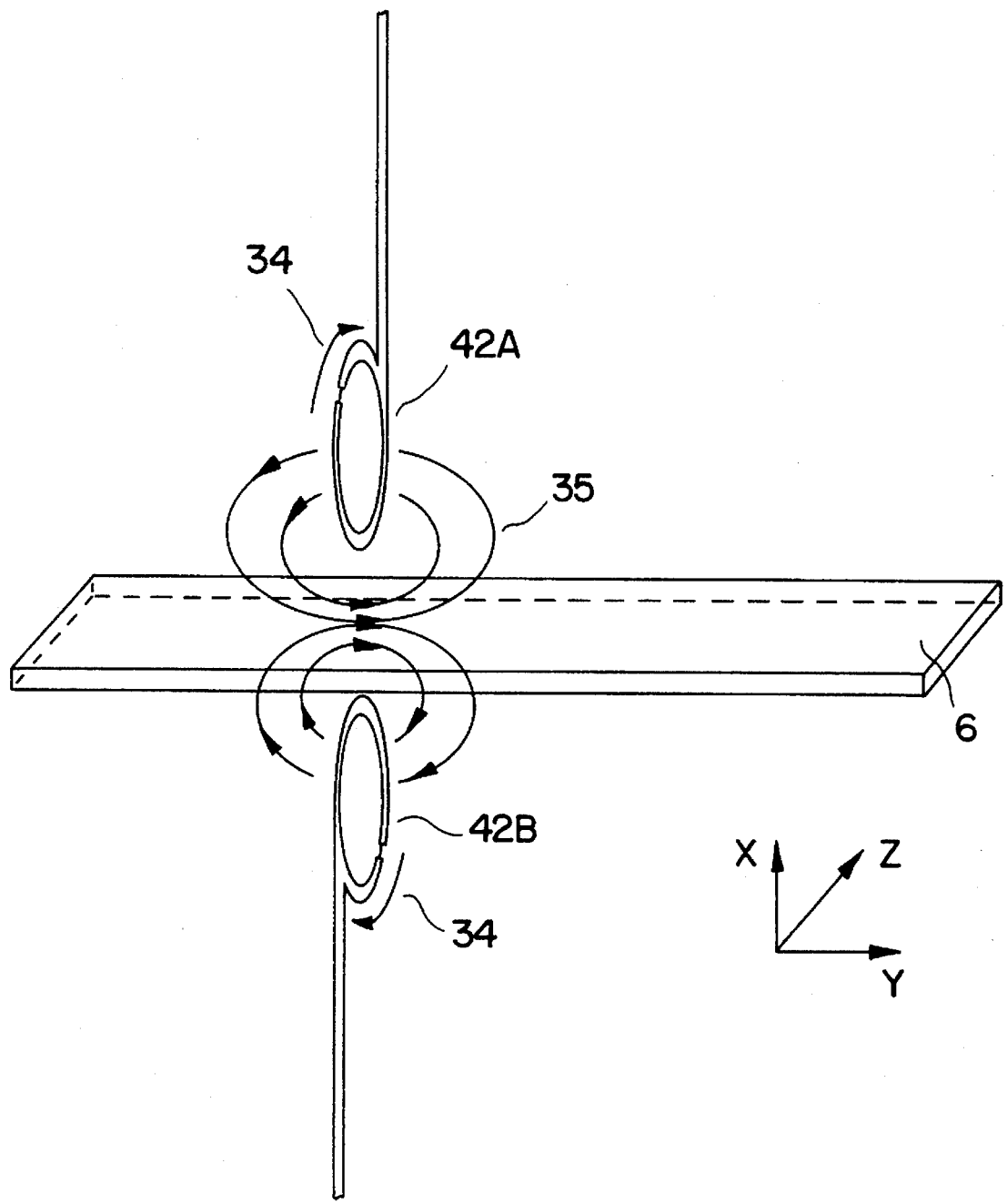
FIG. 15 is a schematic view illustrative of a radio wave irradiation unit involved in an immunity testing apparatus in a fourth embodiment according to the present invention.

FIG. 15 represents the structure of the radiation probe involved in the radio wave irradiation unit 1 involved in the apparatus of the fourth embodiment according to the present invention. Each of the radiation probes may comprise a shielded circular loop antenna probe, whose loop surface faces in the horizontal direction to the surface of the measured sample device 6. The radio wave irradiation unit 1 involved in the immunity testing apparatus may comprise a plurality of pairs of the shielded circular loop antenna probes which are arranged at opposite sides of the measured sample device 6. Individual paired shielded circular loop antenna probes are arranged at symmetrical positions to a plane parallel to the surface of the measured sample device 6 where the loop surface of each of the paired loop antenna probes faces in the same direction as the surface of the measured sample device 6, as illustrated in FIG. 15. An excitation of the loop antenna probe 42A provided at the one side of the measured sample device 6 is carried out to synchronize with an excitation of the loop antenna probe 42B provided at the opposite side of the measured sample device 6. The electrical current flowing through the loop portion of the loop antenna probe may cause a magnetic field having a horizontal component to the loop face of the loop antenna probe. Direction of electrical currents flowing through the loop portion are the same between the paired loop antenna probes 42A and 43B provided at the opposite sides of the measured sample devices 6. The synchronizing excitations of the paired loop antenna probes in which the electrical currents flow through the loop portion in the same direction, as labeled by arrows 34, may apply a magnetic field having a horizontal component to the surface of the measured sample device 6 to a cylindrical space defined by the loop portions of the paired loop antenna probe in which the direction of the magnetic field is directed from the loop antenna probe 42A to the loop antenna probe 42B. The synchronized excitations with the electrical currents flowing through the loop portions of the paired loop antenna probes in the same direction leads to a superposition of the magnetic fields caused by the loop antenna probes 42A and 42B but only the horizontal components thereof, while the vertical components of the magnetic fields are canceled by one another. Then, the measured sample device 6, at an area surrounded by the loops of the antenna probes, is applied with the magnetic field having almost only the horizontal component. This could be understood from FIGS. 16A to 16C.

Figure 16A:
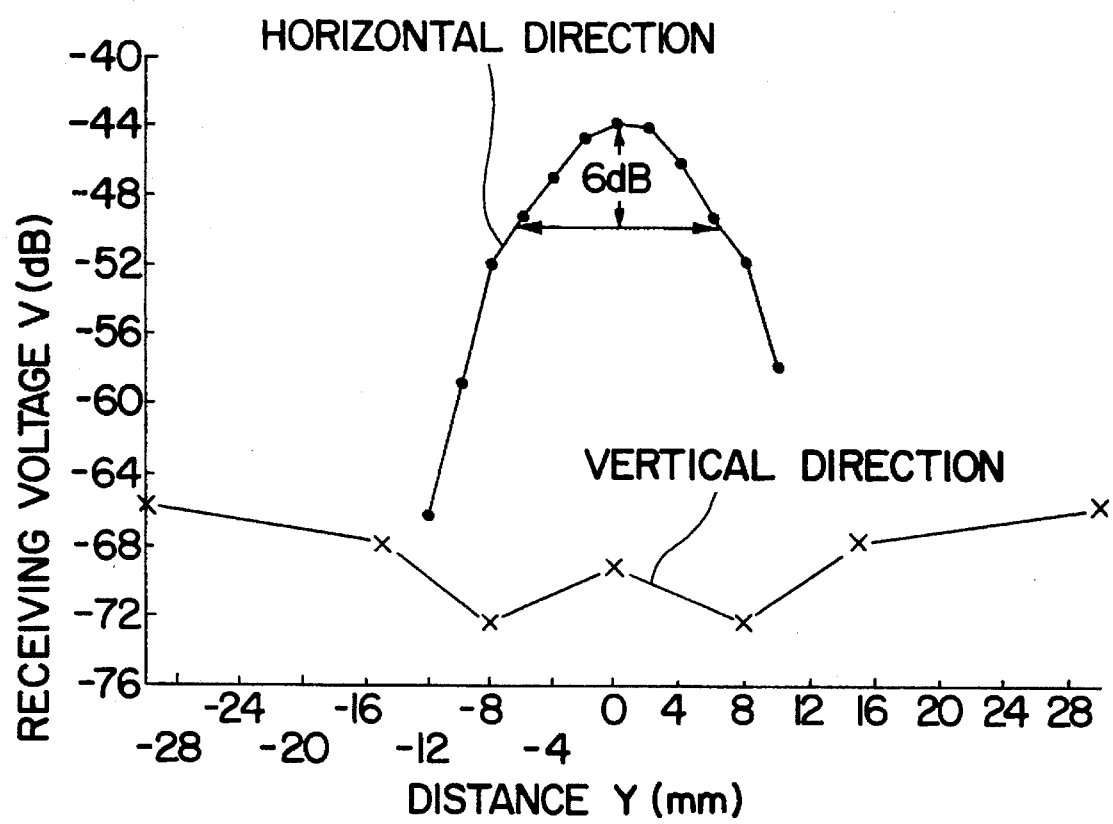
FIGS. 16A to 16C are diagrams illustrative of operations of a radio wave irradiation unit involved in an immunity testing apparatus in a fourth embodiment according to the present invention.
Figure 16B:
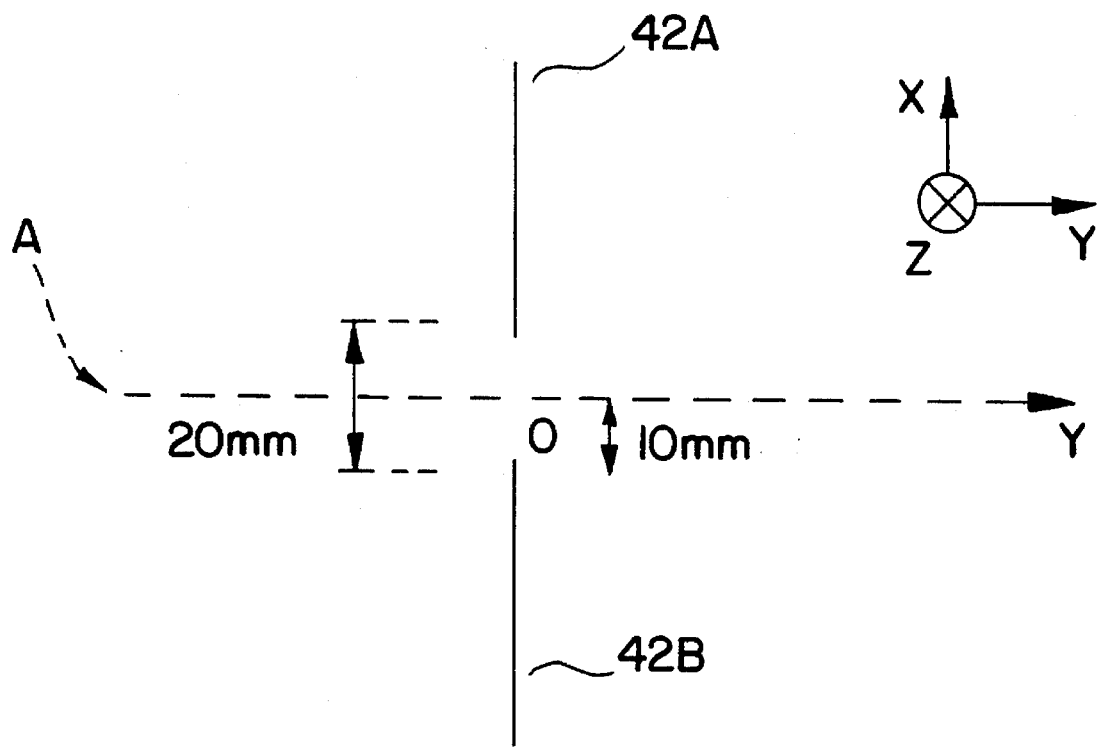
Figure 16C:
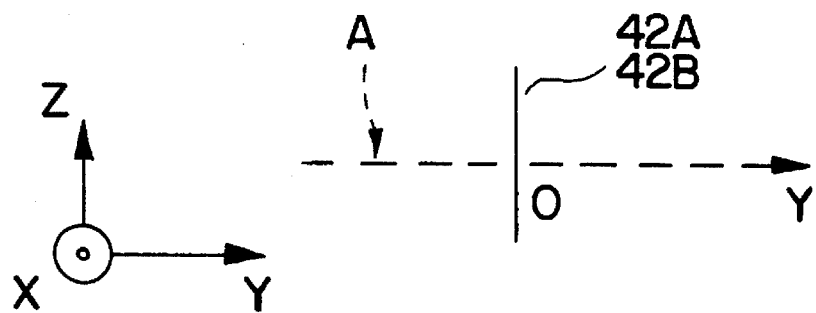

FIG. 16A represents the measurement results of the horizontal and vertical components of the superpositioned magnetic field caused by the paired loop antenna probes. In the measurement, the paired loop antenna probes 42A and 42B are separately positioned at a distance of 20 mm with their loops facing in the same horizontal direction and spaced vertically from the surface of the measured sample device 6. The loop portions of the loop antenna probes have a diameter of 16 mm as illustrated in FIGS. 16B and 16C. A small measuring loop probe is used. The measurements of the magnetic field in both the horizontal and vertical directions are carried out by sweeping the measuring small loop probe in which the measuring small loop probe is moved along a center line A between the paired loop antenna probes 42A and 42B and in a parallel direction to the loop faces of the paired loop antenna probes. The center line A, on which the measuring small loop probe is moved for sweeping, is the same direction as the Y-direction.

In FIG. 16A, the upper solid line represents a horizontal component of the measured magnetic field, while the lower line represents a vertical component of the measured magnetic field. Both components are represented as the intensity of the receiving voltages of the measuring small loop probe. The horizontal component of the measured magnetic field is increased as the measuring small probe achieves a center position of the loop portion of the loop antenna probe and has the maximum value in the vicinity of the center position of the loop portion. The horizontal component of the measured magnetic field is reduced as the measuring small loop probe becomes far from the center position of the loop portion. Within an area surrounded by the loop portion of the loop antenna probe, the vertical component of the magnetic field is held to be high values. By contrast, the vertical component of the magnetic field is held to be low values in the average during the sweep by the measuring small loop probe. It is important that the vertical component of the measured magnetic field is held to be lower values as compared to the horizontal direction within the area surrounded by the loop portion of the loop antenna probe. Accordingly, the magnetic field applied in the area surrounded by the loop portion of the loop antenna probe may approximately be regarded as to have the horizontal component only.

In the radio wave irradiation unit 1, the loop antenna probes are arranged in a matrix adjacent to each other. Accordingly, the measured sample device 6 is applied with the magnetic field having almost only the horizontal component. In the fourth embodiment, the novel apparatus for measuring the immunity or the electromagnetic stress of the measured sample device is as illustrated in FIG. 6. When the control unit 32 controls the switching circuits 22 and 23 involved in the transmitter unit 2 to turn the loop antenna probes 42A and 42B ON and the remaining loop antenna probes OFF, an electric field having the horizontal component is applied to the local part of the measured sample device 6. The measurement of the immunity of the measured sample device 6 may be carried out by placing sequentially one by one the plural pairs of the radiation probes in ON state as described in the first embodiment.

A fifth embodiment of the present invention will be described in which a novel apparatus for conducting an electromagnetic stress test is provided to measure and evaluate an immunity to electromagnetic wave or radio wave interferences for various articles such as electric and electronics devices which tend to suffer any impact of the electromagnetic wave or radio wave interferences.

The novel apparatus for measuring the immunity or the electromagnetic stress provided in the fifth embodiment has the same structure as the structure of the apparatus in the first embodiment as described above, except for the radiation probes. The descriptions of the third embodiment according to the present invention will focus only on the structural difference of the radiation probes between the first and fifth embodiments. A structural difference of the apparatus of the fifth embodiment from that of the first embodiment appears on the radiation probe.

Figure 17:
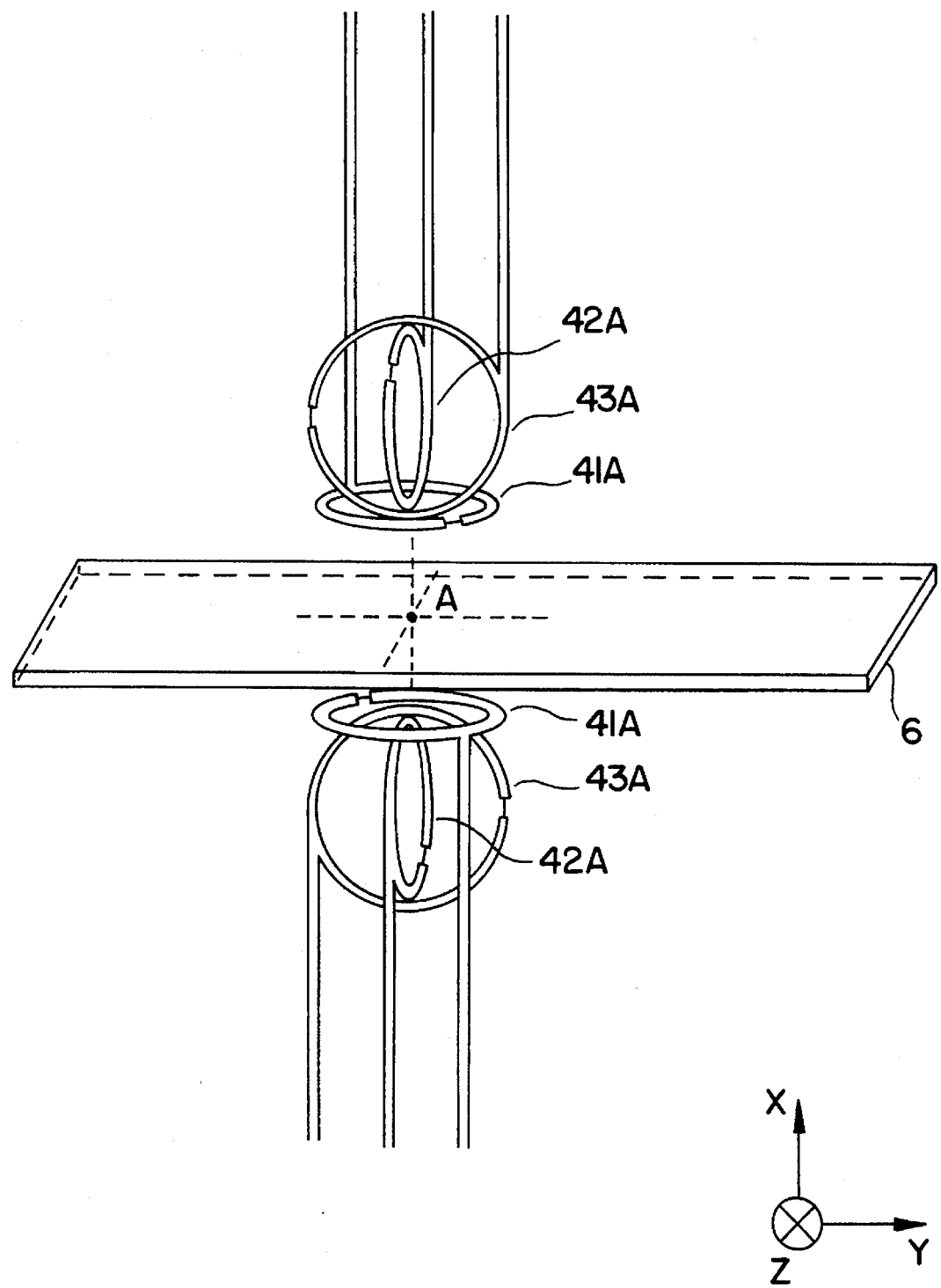
FIG. 17 a schematic view illustrative of a radio wave irradiation unit involved in an immunity testing apparatus in a fifth embodiment according to the present invention.

FIG. 17 represents the structure of the radiation probe involved in the radio wave irradiation unit 1 involved in the apparatus of the fifth embodiment according to the present invention. Each of the radiation probes may comprise triplets of shielded circular loop antenna probes. The first one 41A has a loop face parallel to the surface of the measured sample device 6 and thus the loop face faces in the X-direction. The first one 41A of each triplet of the loop antennas directed in the X-direction is to apply a magnetic field having a vertical direction or in the X-direction to the measured sample device 6. The second one 42A has a loop face perpendicular to the surface of the measured sample device 6 and thus the loop face faces in the Y-direction. The second one 42A of each triplet of the loop antennas directed in the Y-direction is to apply a magnetic field having a horizontal direction or in the Y-direction to the measured sample device 6. The third one 43A has a loop face perpendicular to the surface of the measured sample device 6 but perpendicular to the loop face of the second one, and thus the loop face faces in the Z-direction. The third one 43A of each triplet of the loop antennas directed in the Z-direction is to apply a magnetic field having a horizontal direction or in the Z-direction to the measured sample device 6.

The radio wave irradiation unit 1 involved in the immunity testing apparatus may comprise a plurality of pairs in which each pair comprises two sets of triplets of the shielded circular loop antenna probes. The paired set of triplets are arranged at opposite sides of the measured sample device 6. Individual paired sets of triplets of shielded circular loop antenna probes are arranged at symmetrical positions to a plane parallel to the surface of the measured sample device 6 where the loop faces of individual triplicated loop antenna probes are directed toward the different directions from each other, for example, in the X-direction, the Y-direction and the Z-direction as illustrated in FIG. 17.

An excitation of the loop antenna probes 41A, 42A and 43A provided at the one side of the measured sample device 6 is carried out to synchronize with an excitation of the corresponding loop antenna probe 41B, 42B and 43B respectively provided at the opposite side of the measured sample device 6.

Figure 18:
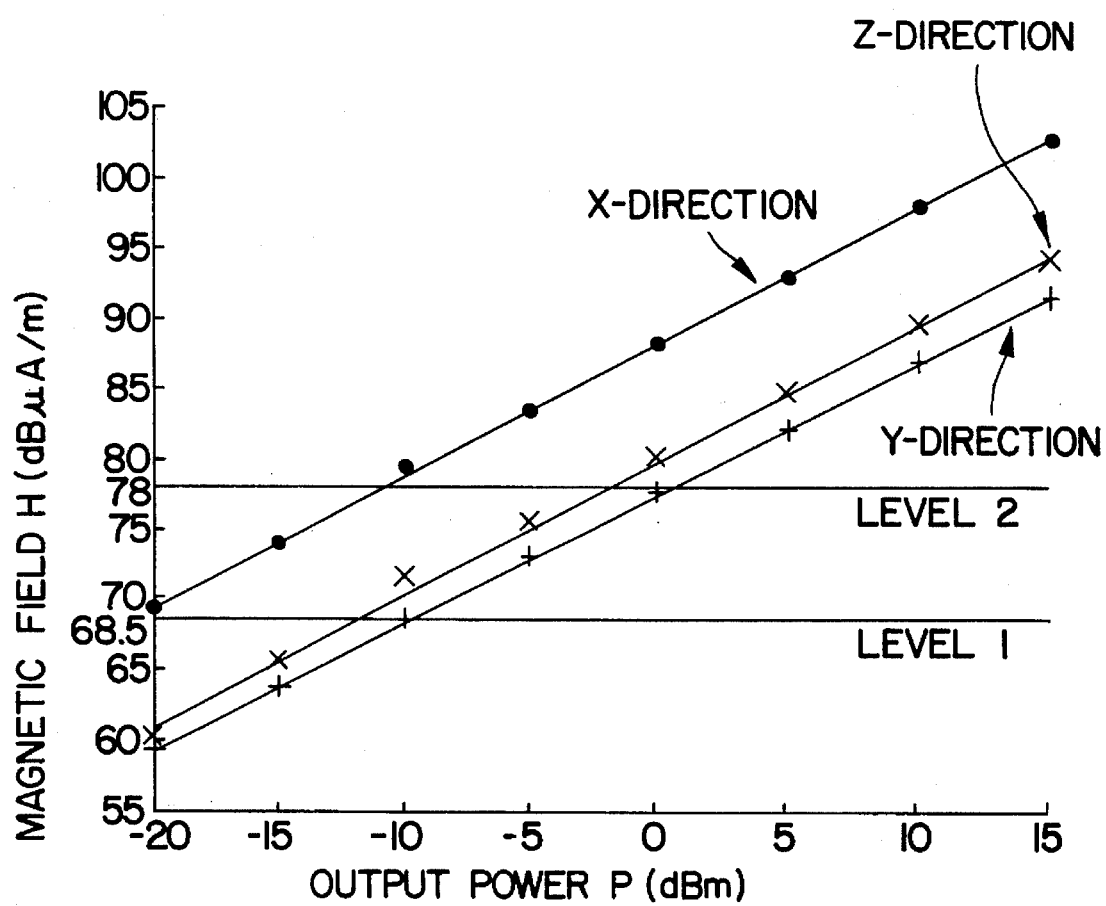
FIG. 18 is a diagram illustrative of operations of a radio wave irradiation unit involved in an immunity testing apparatus in a fifth embodiment according to the present invention.
Figure 19:
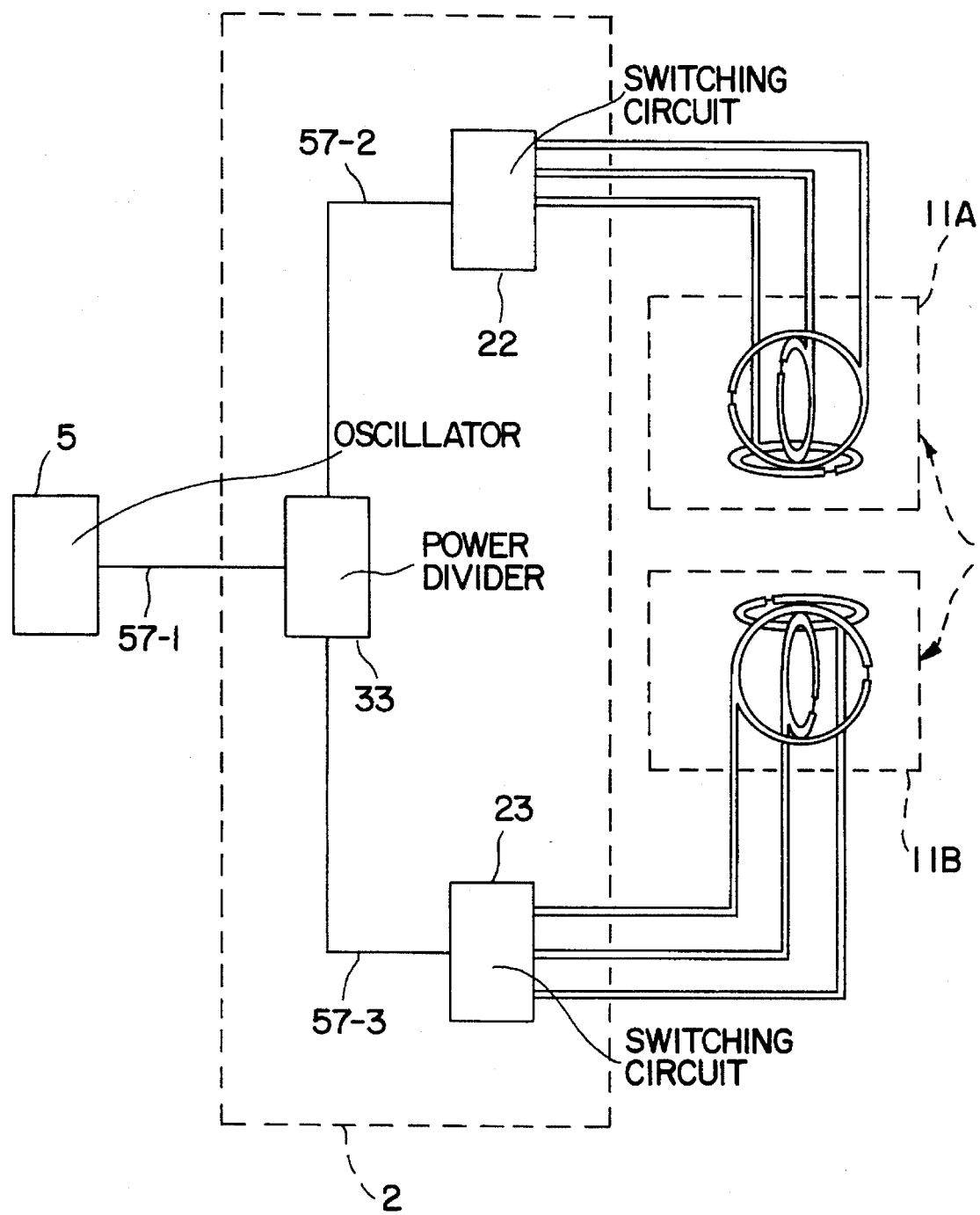
FIG. 19 is a fragmentary diagram illustrative of an immunity testing apparatus of a sixth embodiment according to the present invention.

FIG. 18 represents the measurement results of the horizontal and vertical components of the superpositioned magnetic field caused by the paired loop antenna probes. In the measurement, the paired loop antenna probes are separately positioned at a distance of 20 mm. The frequency is 100 MHz. A small measuring loop probe is used. The measurements of the magnetic field in both the horizontal and vertical directions are carried out by sweeping the measuring small loop probe in which the measuring small loop probe is moved along a center line A between the paired loop antenna probes 42A and 42B and in a parallel direction to the loop faces of the paired loop antenna probes. However, the measurements of the magnetic field in the X, Y and Z directions are independently carried out.

The levels 1 and 2 of intensities of the magnetic field are achieved by the immunity testing apparatus of this embodiment. If it is required to apply a magnetic field having much larger intensity, it may be possible to modify the transmitter unit so as to insert a further power amplifier between the oscillator 5 and the unbalanced/balanced conversion circuit 21.

In the radio wave irradiation unit 1, the loop antenna probes are arranged in matrix adjacent to each other. Accordingly, the measured sample device 6 is applied with the magnetic field having the three directional components. In the fifth embodiment, the novel apparatus for measuring the immunity or the electromagnetic stress of the measured sample device is as illustrated in FIG. 6. When the control unit 32 controls the switching circuits 22 and 23 involved in the transmitter unit 2 to turn the specific loop antenna probes, for example, 41A and 41B ON and the remaining loop antenna probes OFF, an electric field having the vertical component is applied to the local part of the measured sample device 6. The measurement of the immunity of the measured sample device 6 may be carried out by placing sequentially one by one the radiation probes in ON state as described in the first embodiment.

A sixth embodiment of the present invention will be described in which a novel apparatus for conducting an electromagnetic stress test is provided to measure and evaluate an immunity to electromagnetic wave or radio wave interferences for various articles such as electric and electronics devices which tend to suffer any impact of the electromagnetic wave or radio wave interferences.

A structural difference of the immunity testing apparatuses between the sixth and first embodiments is in a circuit configuration of the transmitter unit 2. The transmitter unit 2 of the sixth embodiment comprises a power divided 33 being electrically connected to the oscillator 5, first and second switching circuits 22 and 23 being electrically connected to the power divider 33 through first and second radio wave signal transmission line 57-1 and 57-2 respectively.

A seventh embodiment of the present invention will be described in which a novel apparatus for conducting an electromagnetic stress test is provided to measure and evaluate an immunity to electromagnetic wave or radio wave interferences for various articles such as electric and electronics devices which tend to suffer any impact of the electromagnetic wave or radio wave interferences.

Figure 20:
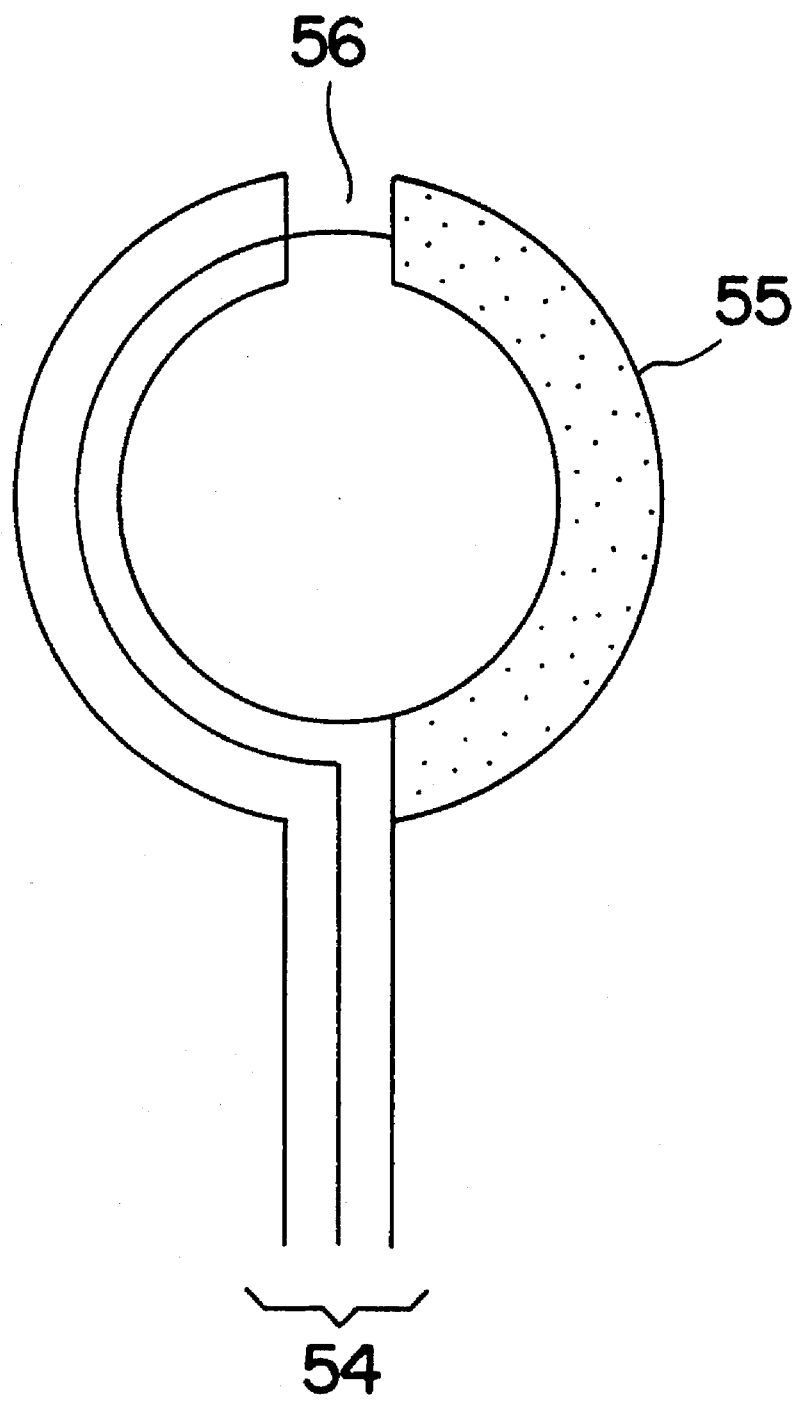
FIG. 20 is a view illustrative of a loop antenna involved in an immunity testing apparatus of a seventh embodiment according to the present invention.

A structural difference of the immunity testing apparatuses between the sixth and first embodiments is in a structure of a loop antenna probe. As illustrated in FIG. 20, the loop antenna probe may comprise a semirigid coaxial cable 54 and a solid rod 55 made of copper with a gap 56 at a top of the semirigid cable.

As a further modification of the radio wave irradiation unit 1, it is available that a plurality of linear antennas are arranged in matrix along the surface of the measured sample device 6 to form a plurality of feeding points for radiating radio waves on the surface of the measured sample device 6.

Whereas modifications of the present invention will no doubt be apparent to a person having ordinary skill in the art, to which the invention pertains, it is to be understood that the embodiments shown and described by way of illustrations are by no means intended to be considered in a limiting since. Accordingly, it is to be intended by the claims to cover all modifications of the invention which fall within the spirit and scope of the invention.

What is claimed is:

1. An electromagnetic wave irradiation unit to be used for electromagnetic wave stress test for an article comprising:

a plurality of pairs of radiation-emitting probes arranged spaced from said article and facing each other on opposite sides of said article so as to permit each pair of said probes to irradiate independently electromagnetic waves in opposite directions on divided local areas on opposite surfaces of said article in said divided local areas corresponding to locations of said probes.

2. The electromagnetic wave irradiation unit as claimed in claim 1, wherein said probes are arranged in a matrix on opposite sides of said article.

3. The electromagnetic wave irradiation unit as claimed in claim 2, wherein the same number of said probes are provided on opposite sides of said article to form a plurality of pairs of said probes being arranged in approximately symmetrical positions on opposite sides of said article.

4. The electromagnetic wave irradiation unit as claimed in claim 2, wherein difference numbers of said probes are provided in asymmetrical positions on opposite sides of said article.

5. The electromagnetic wave irradiation unit as claimed in claim 1, wherein each said probe comprises an electrode plate having a face being approximately parallel to said surface of said article.

6. The electromagnetic wave irradiation unit as claimed in claim 1, wherein each said probe comprises a loop antenna having a loop face approximately parallel to said surface of said article.

7. The electromagnetic wave irradiation unit as claimed in claim 1, wherein each said probe comprises a loop antenna having a loop face approximately perpendicular to said surface of said article.

8. The electromagnetic wave irradiation unit as claimed in claim 1, wherein each said probe comprises a doubled loop antenna comprising a first loop antenna having a loop face approximately parallel to said surface of said article and a second loop antenna having a loop face approximately perpendicular to said surface of said article.

9. The electromagnetic wave irradiation unit as claimed in claim 1, wherein each said probe comprises a triplicated loop antenna comprising a first loop antenna having a loop face approximately parallel to said surface of said article, a second loop antenna having a loop face approximately perpendicular to said surface of said article and a third loop antenna having a loop face approximately perpendicular to both said faces of said first and second loop antennas.

10. The electromagnetic wave irradiation unit as claimed in claim 1, wherein said probes are formed by a matrix arrangement of a plurality of linear antennas.

11. The electromagnetic wave irradiation unit as claimed in claim 1, wherein each said probe comprises a loop antenna comprising a semirigid cable, a solid copper rod and a gap between said cable and said rod.

12. An apparatus for measuring an electromagnetic wave stress of an article comprising:
- an electromagnetic wave irradiation unit comprising a plurality of radiation probes arranged adjacent to each other and along a surface of and spaced from said article at least on one side thereof so as to permit said probes to irradiate independently electromagnetic waves on divided local areas on a surface of said article and said divided local areas corresponding to locations of said probes;
- an oscillator means for generating electromagnetic wave signals to be used for excitations of said radiation probe;
- a transmitter means being electrically connected to both said oscillator means and said radiation probes for receiving said electromagnetic wave signals from said oscillator means and subsequently transmitting said electromagnetic wave signals to said radiation probes; and
- a control means being electrically connected to said article for receiving output signals having information as to existences of any abnormality in individual divided local areas in said article exposed to an electromagnetic wave irradiation, said control means being electrically connected to said transmitter means for controlling operations of said transmitter means to control independently an excitation of each of said plurality of radiation probes.

13. The apparatus as claimed in claim 12, wherein said probes are arranged in a matrix on opposite sides of said article.

14. The apparatus as claimed in claim 13, wherein the same number of said probes are provided on opposite sides of said article to form a plurality of pairs of said probes being arranged in approximately symmetrical positions on opposite sides of said article.

15. The apparatus as claimed in claim 13, wherein different numbers of said probes are provided in asymmetrical positions on opposite sides of said article.

16. The apparatus as claimed in claim 13, wherein said transmitter means includes:
- an unbalanced/balanced conversion circuit being electrically connected to said oscillator means;
- a first switching device being connected to said unbalanced/balanced conversion circuit and said control means;
- a phase shifter being electrically connected to said control means, said first switching device and said radiation probes arranged on one side of said article; and
- a second switching device being connected to said unbalanced/balanced conversion circuit, said control means and said radiation probes arranged on the opposite side of said article.

17. The apparatus as claimed in claim 12, wherein each of said plurality of probes comprises a loop antenna having a loop face approximately parallel to said surface of said article.

18. The apparatus as claimed in claim 12, wherein each of said plurality of probes comprises a loop antenna having a loop face approximately perpendicular to said surface of said article.

19. The apparatus as claimed in claim 12, wherein each of said plurality of probes comprises a doubled loop antenna comprising a first loop antenna having a loop face approximately parallel to said surface of said article and a second loop antenna having a loop face approximately perpendicular to said surface of said article.

20. The apparatus as claimed in claim 12, wherein each of said plurality of probes comprises a triplicated loop antenna comprising a first loop antenna having a loop face approximately parallel to said surface of said article, a second loop antenna having a loop face approximately perpendicular to said surface of said article and a third loop antenna having a loop face approximately perpendicular to both said faces of said first and second loop antennas.

21. The apparatus as claimed in claim 12, wherein said plurality of probes is formed by a matrix arrangement of a plurality of linear antennas.

22. The apparatus as claimed in claim 12, wherein each of said plurality of probes comprises a loop antenna comprising a semirigid cable, a solid copper rod and a gap between said cable and said rod.

23. The apparatus as claimed in claim 12, wherein said plurality of probes is formed as an electrode plate having a face approximately parallel to said surface of said article.

24. The apparatus as claimed in claim 12, wherein said control means controls said transmitter means so that said radiation probes irradiate electromagnetic waves sequentially on said individual divided local areas in said article.

25. The apparatus as claimed in claim 12, wherein said control means comprises:
- a signal waveform processing unit being electrically connected to said article for receiving output signals having information as to abnormalities from said article to subject said output signals to Fourier transformation to obtain spectral signals in frequency;
- a control unit being electrically connected to said signal waveform processing unit for receiving said transformed spectral signals and performing subsequent comparisons of said spectral signals with reference spectrums stored in said control unit to find variations of said spectral signals from said reference signals so as to convert said variations into predetermined immunity levels.

26. The apparatus as claimed in claim 25, further comprising:
- a display means being electrically connected to said control unit for receiving information as to said immunity levels and effecting a subsequent color display in which said individual immunity levels of said individual divided local areas are represented by different colors in the same number of corresponding divided blocks as said local areas.

27. The apparatus as claimed in claim 1, wherein each of said radiation probes is electrically connected through a shielded coaxial cable to said transmitter means.

28. An electromagnetic wave irradiation unit for electro magnetic wave stress testing of an article, comprising:

a plurality of radiation-emitting probes arranged adjacent to each other and on both sides of said article, and a control unit for sequentially activating selected pairs of said radiation-emitting probes, wherein said control unit comprises means for activating a pair of adjacent probes on one side of said article, and means for activating a pair of said probes facing each other on opposite sides of said article.

* * * * *